US006937474B2

(12) United States Patent
Lee

(10) Patent No.: US 6,937,474 B2
(45) Date of Patent: Aug. 30, 2005

(54) CHIPSET COOLING DEVICE OF VIDEO GRAPHIC ADAPTER CARD

(75) Inventor: Sang Cheol Lee, Kyungki-do (KR)

(73) Assignee: Zalman Tech Co. Ltd. (KR)

( * ) Notice: Subject to any disclaimer, the term of this patent is extended or adjusted under 35 U.S.C. 154(b) by 125 days.

(21) Appl. No.: 10/407,373

(22) Filed: Apr. 4, 2003

(65) Prior Publication Data

US 2003/0189815 A1 Oct. 9, 2003

(30) Foreign Application Priority Data

Apr. 6, 2002 (KR) .............................. 10-2002-0018800
May 22, 2002 (KR) .............................. 10-2002-0028363
Mar. 11, 2003 (KR) .............................. 10-2003-0015238

(51) Int. Cl.[7] .............................................. H05K 7/20
(52) U.S. Cl. .................... 361/715; 361/704; 361/687; 165/104.21; 165/46; 174/15.2
(58) Field of Search ................................. 361/683, 686, 361/687, 690–697, 694, 700–712, 714–727, 729, 802, 803, 816; 257/706–727; 174/15.1, 16.3, 252; 454/184; 165/80.2, 80.3, 104.33, 185, 104.32, 106.33, 121, 122, 106

(56) References Cited

U.S. PATENT DOCUMENTS

| 3,852,804 | A |   | 12/1974 | Corman et al. ............... 357/82 |
|---|---|---|---|---|
| 4,315,300 | A |   | 2/1982 | Parmerlee et al. ........... 361/382 |
| 5,283,715 | A | * | 2/1994 | Carlsten et al. .............. 361/702 |
| 5,424,916 | A |   | 6/1995 | Martin ........................ 361/698 |
| 5,457,603 | A |   | 10/1995 | Leeb ............................ 361/698 |
| 5,815,371 | A |   | 9/1998 | Jeffries et al. ............... 361/704 |
| 5,921,315 | A |   | 7/1999 | Dinh ...................... 165/104.21 |
| 5,959,837 | A |   | 9/1999 | Yu ............................... 361/697 |
| 5,960,865 | A |   | 10/1999 | Costa et al. ................... 165/86 |
| 6,016,251 | A |   | 1/2000 | Koide et al. ................ 361/699 |
| 6,021,044 | A |   | 2/2000 | Neville, Jr. et al. .......... 361/700 |
| 6,122,169 | A | * | 9/2000 | Liu et al. ..................... 361/700 |

(Continued)

FOREIGN PATENT DOCUMENTS

| JP | 64-020699 |   | 1/1989 |   |   |
|---|---|---|---|---|---|
| JP | 409027690 | A | * | 1/1997 | ............ H05K/7/20 |
| JP | 09-113158 |   | 2/1997 |   |   |
| JP | 410335860 | A | * | 5/1997 | ............ H05K/7/20 |
| JP | 10-275032 |   | 10/1998 |   |   |
| JP | 11-095873 |   | 4/1999 |   |   |
| JP | 11-287577 |   | 10/1999 |   |   |
| JP | 11-330757 |   | 11/1999 |   |   |
| JP | 2000-227821 |   | 8/2000 |   |   |
| JP | 2000-250660 |   | 9/2000 |   |   |
| JP | 2000-222072 |   | 11/2000 |   |   |
| JP | 2000-349481 |   | 12/2000 |   |   |
| JP | 2000-353029 |   | 12/2000 |   |   |
| JP | 2001-005567 |   | 1/2001 |   |   |
| JP | 2001-236145 |   | 8/2001 |   |   |
| JP | 2001-318738 |   | 11/2001 |   |   |
| JP | 2001-356842 |   | 12/2001 |   |   |
| KR | 1020020017475 | A |   | 7/2002 |   |

*Primary Examiner*—Michael Datskovskiy
(74) *Attorney, Agent, or Firm*—St. Onge Steward Johnston & Reens LLC

(57) ABSTRACT

A chipset cooling device of a video graphics adapter (VGA) card that includes two heatsinks mounted on respective opposite surfaces of a VGA card to collectively cool a chipset of the VGA card is provided. In the chipset cooling device of a VGA card, two heatsinks are mounted on opposite surfaces of a printed circuit board (PCB) of the VGA card, respectively, and connected together by a heatpipe. Due to the use of two heatsinks to collectively cool a chipset, cooling efficiency is higher as opposed to using a single heatsink. In particular, a binding portion between a heatsink contacting the chipset of the VGA card and the heatpipe is always positioned at a lower level than a binding portion between the other, opposite heatsink and the heatpipe, thereby further enhancing the heat conduction performance of the heatpipe.

19 Claims, 29 Drawing Sheets

U.S. PATENT DOCUMENTS

| | | | |
|---|---|---|---|
| 6,137,682 A | 10/2000 | Ishimine et al. | 361/704 |
| 6,181,556 B1 * | 1/2001 | Allman | 361/690 |
| 6,349,035 B1 * | 2/2002 | Koenen | 361/719 |
| 6,394,175 B1 | 5/2002 | Chen et al. | 165/80.3 |
| 6,415,612 B1 | 7/2002 | Pokharna et al. | 62/3.2 |
| 6,525,934 B1 | 2/2003 | Nakanishi et al. | 361/687 |
| 6,529,377 B1 | 3/2003 | Nelson et al. | 361/699 |
| 6,530,419 B1 | 3/2003 | Suzuki | 165/80.3 |
| 6,542,365 B2 * | 4/2003 | Inoue | 361/699 |
| 6,585,039 B2 | 7/2003 | Sagal et al. | 165/185 |
| 6,708,754 B2 * | 3/2004 | Wei | 165/46 |
| 6,717,811 B2 * | 4/2004 | Lo et al. | 361/698 |
| 2003/0056942 A1 * | 3/2003 | Ota et al. | 165/104.33 |
| 2003/0090873 A1 | 5/2003 | Ohkouchi | 361/704 |
| 2003/0136548 A1 | 7/2003 | Parish et al. | 165/104.21 |

* cited by examiner

CHIPSET COOLING DEVICE OF VIDEO GRAPHIC ADAPTER CARD

CROSS-REFERENCES TO RELATED APPLICATIONS

This application claims priority from Korean Patent Application No. 2002-18800 filed on Apr. 6, 2002, No. 2002-28363 filed on May 22, 2002, and No. 2003-15238 filed on Mar. 11, 2003, in the Korean Intellectual Property Office, the disclosures of which are incorporated herein in their entirety by reference.

BACKGROUND OF THE INVENTION

1. Field of the Invention

The present invention relates to a chipset cooling device of a video graphics adapter (VGA) card, including two heatsinks mounted on respective opposite surfaces of a VGA card to collectively cool a chipset of the VGA card.

2. Description of the Related Art

In a computer case, a mainboard and a plurality of cards, which are inserted into the mainboard to be connected to a central processing unit (CPU) through circuits, are installed. A typical example of such a card is a VGA card, and a TV card, a sound card, or a telecommunications card can be optionally installed. Such cards are inserted into connection ports in the mainboard.

A VGA card internally processes video information transmitted from the CPU in its own chipset and transmits the processed information to a monitor to allow a user to view text or graphics.

Most currently released VGA cards are designed to enable computationally intensive graphics processing or 3-dimensional (3-D) gaming. Such VGA cards take part of the task charged to the CPU and thus require high internal integration density, so that they generate a large amount of heat during operation. This is the reason that an additional chipset cooling device is mounted on the VGA card.

Conventionally, VGA cards have been cooled by attaching a heatsink to the chipset of a VGA card or by additionally attaching a cooling fan to the heat ink to dissipate heat generated by the chipset. However, cooling fans generate noise and, since they have moving parts, eventually wear out.

Chipsets that generate heat can be effectively cooled with large heatsinks having high heat dissipating efficiency. However, it is impractical to install such a large, high-capacity heatsink because the space between cards is usually narrow.

SUMMARY OF THE INVENTION

To address the above limitations, the present invention provides a chipset cooling device of a video graphics adapter (VGA) card, including two heatsinks mounted on opposite surfaces of a printed circuit board (PCB) of the VGA card, respectively, and connected together by a heatpipe. Since the chipset cooling device of the VGA card according to the present invention includes two heatsinks to collectively cool a chipset, cooling efficiency is higher compared with conventional cooling devices using a single heatsink. In particular, a binding portion between a heatsink contacting the chipset and the heatpipe is always positioned at a lower level than a binding portion between the other, opposite heatsink and the heatpipe, thereby further enhancing the heat conduction performance of the heatpipe.

In accordance with an aspect of the present invention, there is provided a chipset cooling device of a VGA card, which cools a chipset mounted on a printed circuit board of the video graphics adapter card, the chipset cooling device comprising: a first heatsink mounted on the same side as the chipset to dissipate heat generated by the chipset; a second heatsink mounted on a side opposite to the first heatsink, with the PCB between the first and second heatsink; and at least one heatpipe which connects the first heatsink and the second heatsink so as to transfer heat from the first heatsink to the second heatsink.

According to specific embodiments of the present invention, the heatpipe is installed in a position such that, when the video graphics adapter card is installed in a computer case, an end portion of the heatpipe connected to the first heatsink is at a lower level than the other end portion connected to the second heatsink. Each of the first and second heatsinks includes a heatpipe insertion hole which tightens around the heatpipe, and the first and second heatsinks are connected by inserting the heatpipe into the heatpipe insertion holes. In this case, each of the first and second heatsinks is comprised of two portions which together form the heatpipe insertion hole.

As an embodiment, the first heatsink comprises: a heat-conducting block mounted to contact the top surface of the chipset to absorb heat generated by the chipset and having a first heatpipe receiving groove which receives and contacts an end portion the heatpipe; and a fin plate tightly bound to the heat-conducting block and having a plurality of heat-dissipating fins which dissipate heat conducted via the heat-conducting block and a second heatpipe receiving groove which, together with the first heatpipe receiving groove, forms the heatpipe insertion hole of the first heatsink that receives and tightens around the an end portion of the heatpipe. The second heatsink comprises: a support block mounted to be spaced apart from the printed circuit board and having a first heatpipe receiving groove which receives and contacts the other end portion of the heatpipe; and a fin plate supported by being tightly bound to the support block and having a plurality of heat-dissipating fins which dissipate heat conducted to the fin plate along the heatpipe and a second heatpipe receiving groove which forms, together with the first heatpipe receiving groove, forms the heatpipe insertion hole of the second heatsink that receives and tightens around the other end portion of the heatpipe. The chipset cooling device further comprises a fixing unit which binds the first and second heatsinks to the printed circuit board.

In the above embodiment, the first heatsink comprises at least two heatpipe insertion holes which are parallel to one another, the second heatsink comprises heatsink insertion holes which are parallel to one another and correspond with the heatpipe insertion holes of the first heatsink, and the end portions of the heatpipe are inserted into each of the heatpipe insertion holes of the first and second heatsinks.

In another embodiment of a chipset cooling device of a VGA according to the present invention, each of the first and second heatsinks comprises at least two heatpipe insertion holes and is comprised of two portions which together form the heatpipe insertion holes. In this case, the first heatsink may comprise: a heat-conducting block mounted to contact the top surface of the chipset to absorb heat generated by the chipset and having at least two first heatpipe receiving grooves which receive and contact the heatpipe; and a fin plate tightly bound to the heat-conducting block and having a plurality of heat-dissipating fins which dissipate heat conducted via the heat-conducting block and second heatpipe receiving grooves which, together with the first heatpipe receiving grooves, form the heatpipe insertion holes of the first heatsink that receive and tighten around the heatpipe. The second heatsink may comprise: a support block mounted to be spaced apart from the printed circuit board and having at least two first heatpipe receiving grooves which receive and contact the heatpipe; and a fin plate supported by being tightly bound to the support block and having a plurality of heat-dissipating fins which dissipate heat conducted to the fin plate along the heatpipe and second heatpipe receiving grooves which form, together with the first heatpipe receiving holes, the heatpipe insertion holes of the second heatsink that receive and tighten around the heatpipe. The chipset cooling device may further comprise a fixing unit which binds the first and second heatsinks to the printed circuit board. The heatpipe may be formed by folding a single heatpipe in a pattern in which the heatpipe fits into every heatpipe insertion hole of the first and second heatsinks.

A chipset cooling device of a VGA card according to the present invention may further comprise a cooling fan attached to the first heatsink. In this case, the fin plate of the first heatsink comprises a plurality of ventilation holes in a region, and the cooling fan is fixed to correspond to the region having the plurality of ventilation holes.

According to specific embodiments of the present invention, the heat-conducting block of the first heatsink further comprises a third heatpipe receiving groove near the first heatpipe receiving groove, which has the same shape as the first heatpipe receiving groove; the fin plate of the first heatsink further comprises a fourth heatpipe receiving groove which, together with the third heatpipe receiving groove, forms a heatpipe insertion hole that receives and tightens around the heatpipe; the fin plate of the second heatsink further comprises a heatpipe insertion hole extending parallel to and along the entire length of the fin plate; and the chipset cooling device further comprises a second heatpipe having an end portion inserted into the heatpipe insertion hole formed by the third and fourth heatpipe receiving grooves of the first heatsink and the other end portion inserted into the heatpipe insertion hole formed through the fin plate of the second heatsink.

A chipset cooling device according to the present invention further comprises a cooling fan mounted on edges of the fin plates of the first and second heatsinks.

A chipset cooling device according to the present invention further comprises at least one spacing unit attached to edges of the fin plates of the first and second heatsinks to space apart the fin plates and secure the binding of the first and second heatsinks. In this case, a side support groove is formed at an edge of each fin plate of the first and second heatsinks. The spacing unit comprises: a rigid support bridge whose both ends extend toward the side support grooves of the fin plates of the first and second heatsinks; bolts passing through both ends of the support bridge and entering the side support grooves; and a nut slid into each of the side support grooves and engaging the bolt so that the support bridge is bound to the fin plates.

In a chipset cooling device of a VGA card according to the present invent, the fin plates of the first and second heatsinks are connected as a single body by a connection member.

A chipset cooling device of a VGA card, which cools a chipset mounted on a printed circuit board of the VGA card, according to another embodiment of the present invention comprises: a heatsink mounted on the same side as the chipset to dissipate heat generated by the chipset; and at least one heatpipe folded at least once such that an end portion of the heatpipe goes around the printed circuit board and extends along a side opposite to the chipset and the other end portion of the heatpipe is attached to the heatsink. Alternatively, the heatsink comprises at least two heatpipe insertion holes and is comprised of two portions which together form the heatpipe insertion holes. For example, the heatsink comprises: a heat-conducting block mounted to contact the top surface of the chipset to absorb heat generated by the chipset and having at least two first heatpipe receiving grooves which receive and contact the heatpipe; and a fin plate tightly bound to the heat-conducting block and having a plurality of heat-dissipating fins which dissipate heat conducted via the heat-conducting block and second heatpipe receiving grooves which, together with the first heatpipe receiving grooves, form the heatpipe insertion holes of the heatsink that receive and tighten around the heatpipe. The chipset cooling device further comprises a fixing unit which binds the heatsink to the printed circuit board, and the heatpipe is fitted into every heatpipe insertion hole of the heatsink.

According to specific embodiments of the above chipset cooling device, the heatpipe is formed by folding a single heatpipe in a pattern in which the heatpipes fits into every heatpipe insertion hole of the heatsink. The chipset cooling device may comprises a plurality of heatpipes each having an end portion coupled to the heatpipe insertion holes of the heatsink and the other end portion extending along and parallel to the side of the printed circuit board opposite to the heatsink. The plurality of heatpipes are installed in a position such that, when the video graphics adapter card is installed in a computer case, the end portion of each of the heatpipes coupled to the heatsink is at a lower level than its other end portion.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE DRAWINGS

Various embodiments of a chipset cooling device of a video graphics adapter (VGA) card according to the present invention will be described in detail with reference to the appended drawings.

Figure 1:
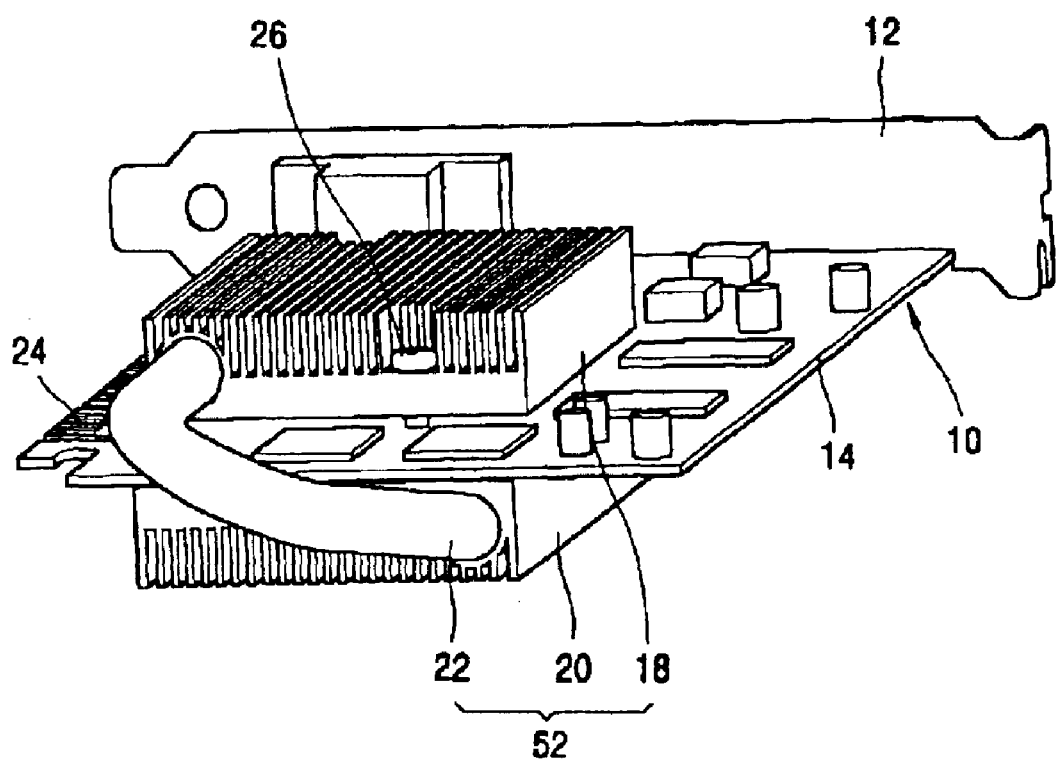
FIG. 1 is a perspective view of a chipset cooling device of a video graphics adapter (VGA) card according to a first embodiment of the present invention.

Referring to FIG. 1, which is a perspective view of a chipset cooling device of a VGA card according to a first embodiment of the present invention, a chipset cooling device 52 includes a first heatsink 18 contacting a surface of a chipset C (shown in FIG. 2) mounted on one surface of a printed circuit board (PCB) 14 of a VGA card 10, a second heatsink 20 mounted on the other surface of the PCB 14, separated a predetermined distance from the surface of the PCB 14, and a heatpipe 22 connecting the first and second heatsinks 18 and 20.

As is well known, the VGA card 10 is inserted into a card connection port 48 (shown in FIG. 6) on a mainboard 42 (shown in FIG. 6) and is controlled by a central processing unit (CPU). A connector 24 is formed on one edge of the PCB 14 to be connected to a circuit on the mainboard 42 via the card connection port 48.

An installation bracket 12 is formed on the rear edge of the PCB 14. The installation bracket 12 is fixed to the PCB 14 and is coupled to an installation frame 46 (shown in FIG. 6) of a computer case to tightly support the VGA card 10 against the mainboard 42.

The first heatsink 18 is designed to have a flat hexahedral shape in consideration of a narrow space between cards. The first heat sink 18 is mounted on the chipset C (shown in FIG. 2) and is spaced from the surface of the PCB 14 by the thickness of the chipset C. The bottom of the first heatsink 18 is made to be flat to contact the entire surface of the chipset C.

The bottom of the second heatsink 20 faces the PCB 14 and is parallel to the PCB 14. The second heatsink 20, which cools the chipset C in cooperation with the first heatsink 18, is formed to have a flat shape, like the first heatsink 18. Since the second heatsink 20 is installed on a surface of the PCB 14 where no electronic parts are mounted and the size of the second heatsink 20 is not limited by electronic parts, the second heatsink 20 can be formed to be larger than the first heatsink 18.

The heatpipe 22 connecting the first and second heatsinks 18 and 20, a known effective heat conductor shaped to be long to rapidly conduct heat in the lengthwise direction, includes a sealed metallic tube, a working fluid partially filling the metallic tube, which exists in liquid form when not heated, and a wick. The metallic tube may be formed of copper, aluminium, gold, or silver, which are known for good thermal conductivity. The working fluid may be methanol, ethanol, water, or the like.

In connecting the heatpipe 22 to the first and second heatsinks 18 and 20, while an end portion of the heatpipe 22 is connected to the first heatsink 18, the heatpipe goes around the edge of the PCB 14 and the other end portion of the heatpipe 22 is connected to the second heatsink 20. Alternatively, the other end portion of the heatpipe 22 may be connected to the second heatsink 20 by directly penetrating through the PCB 14.

Figure 2:
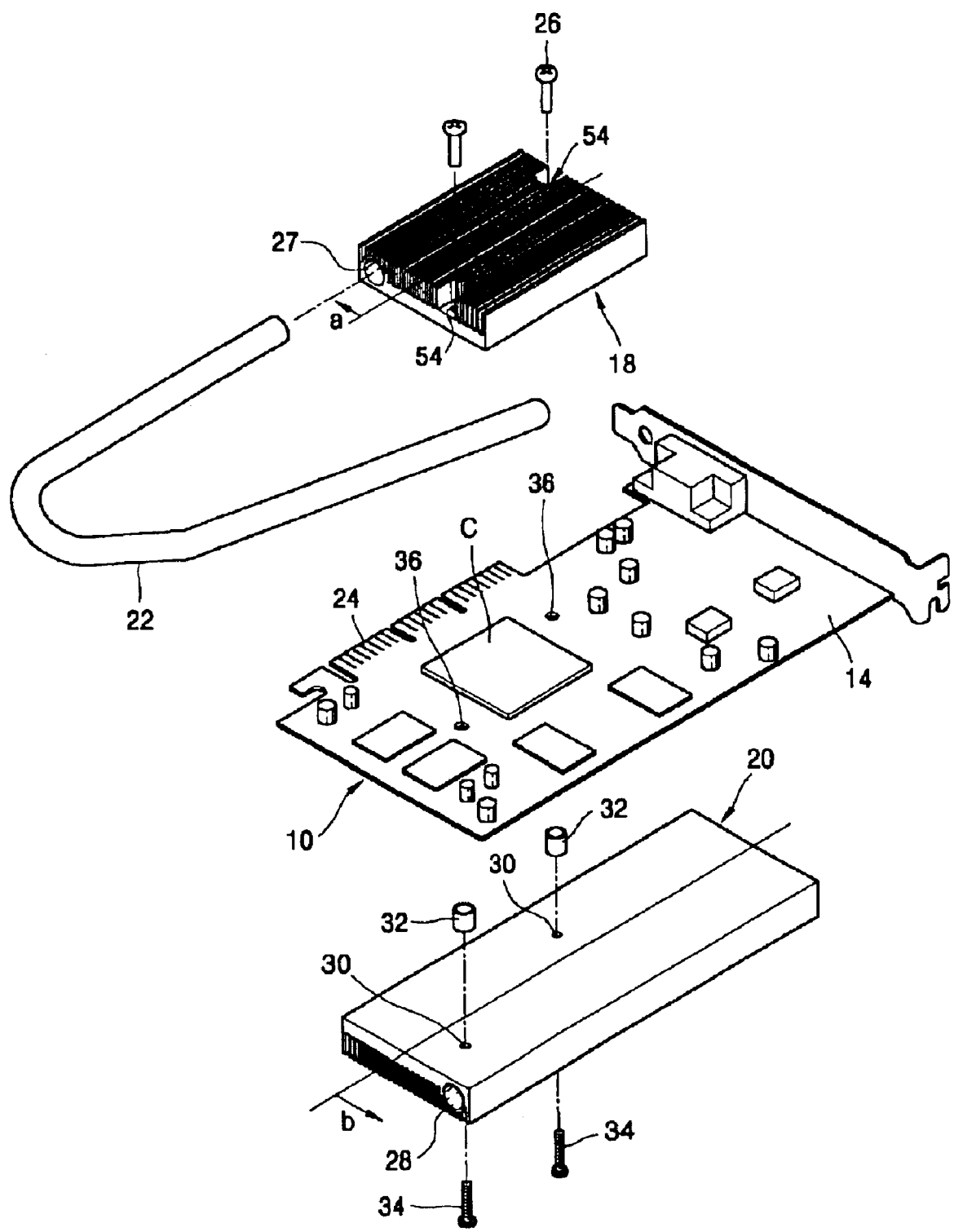
FIG. 2 is an exploded perspective view of the chipset cooling device shown in FIG. 1 detached from a VGA card.

FIG. 2 is an exploded perspective view of the chipset cooling device shown in FIG. 1 detached from the VGA card 10. Referring to FIG. 2, the chipset C generating heat is mounted on the PCB 14 of the VGA card 10. Two heatsink mounting holes 36 are formed near the chipset C in the PCB 14. The heatsink mounting holes 36 are used to bind the first and second heatsinks 18 and 20 to the PCB 14. It will be appreciated that the positions of the heatsink mounting holes 36 can vary depending on the kind of PCB 14 used and the shape of the first and second heatsinks 18 and 20.

A heatpipe insertion hole 27 is formed along one side of the first heatsink 18 mounted on the chipset C. The heatpipe insertion hole 27 having a predetermined diameter is a through hole extending parallel to the edge of the PCB 14 with the connector 24 and to the top surface of the PCB 14. An end portion of the heatpipe 22 is inserted into and fixed in the heatpipe insertion hole 27. In this state, the inner surface of the heatpipe insertion hole 27 tightly contacts the outer surface of the heatpipe 22.

The heatpipe insertion hole 27 is displaced from the center of the first heatsink 18 toward the connector 24, i.e., in the direction indicated by arrow "a". It is preferable that the heatpipe insertion hole 27 is formed to be displaced as far away from the center of the first heatsink 18 as possible without affecting the circular shape of the heatpipe insertion hole 27.

The second heatsink 20 also includes a heatpipe insertion hole 28. The heatpipe insertion hole 28 extends through the second heatsink 20 parallel to the heatpipe insertion hole 27 of the first heatsink 18.

The heatpipe insertion hole 28 is displaced from the center of the second heatsink 20 in the direction indicated by arrow "b". The amount of this displacement in the direction indicated by arrow "b" may be varied, however it is preferable that it be as large as possible without affecting the circular shape of the heatpipe insertion hole 28. The other end portion of the heatpipe 22 is inserted into and fixed in the heatpipe insertion hole 28. In this state, the outer surface of the heatpipe 22 tightly contacts the inner surface of the heatpipe insertion hole 28.

The first heatsink 18 includes two pin holes 54. The pin holes 54 are vertical through holes through which the internally threaded pins 26 are inserted downward toward the PCB 14 to engage the coupling bolts 34.

The second heatsink 20 also has two bolt holes 30. The bolt holes 30 are vertical through holes through which the coupling bolts 34 are inserted upward to screw into the internally threaded pins 26 via spacers 32, respectively.

The heatsink mounting holes 36 in the PCB 14, the pin holes 54 in the first heatsink 18, and the bolt holes 30 in the second heatsink 20 are formed to be aligned along the same axes, which is described later with reference to FIG. 5.

The spacers 32 are interposed between the PCB 14 and the second heatsink 20 to space the second heatsink 20 from the PCB 14 by a constant distance.

Figure 3:
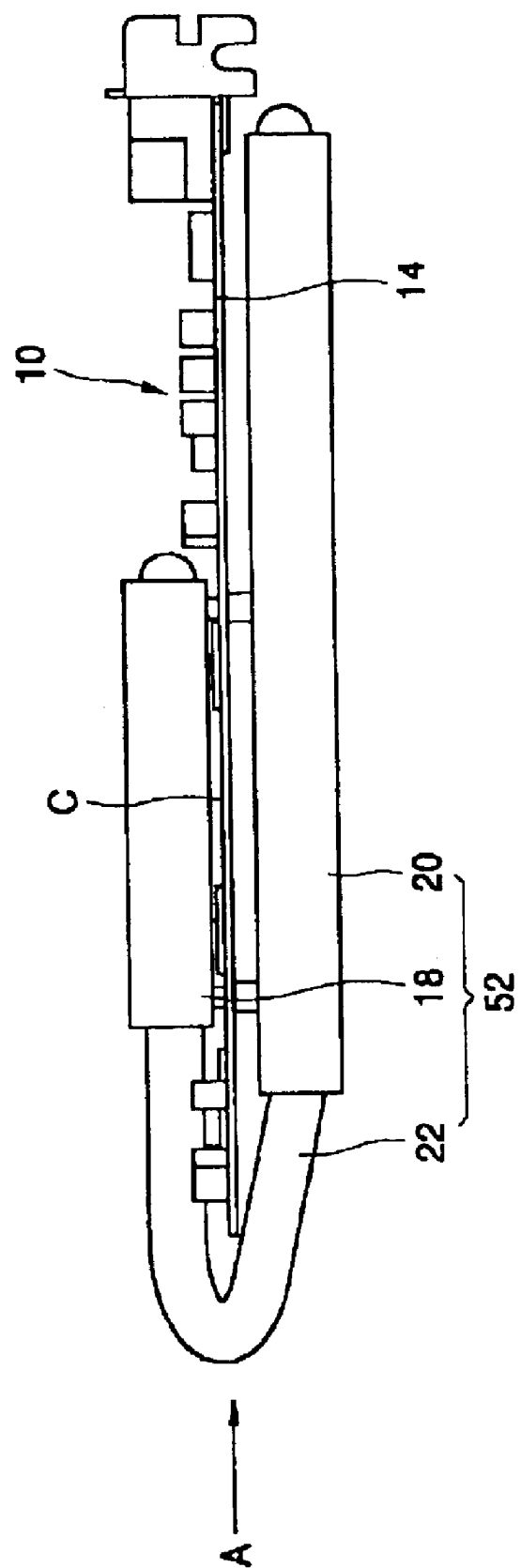
FIG. 3 is a side view of the chipset cooling device shown in FIG. 1.

FIG. 3 is a side view of the chipset cooling device of the VGA card shown in FIG. 1 according to the present invention. As shown in FIG. 3, the first heatsink 18 is mounted on the top of the PCB 14, and the second heatsink 20 is mounted on the bottom of the PCB 14. The chipset C is underneath the first heatsink 18, and the first and second heatsinks 18 and 20 are connected to each other by the heatpipe 22.

Figure 4:
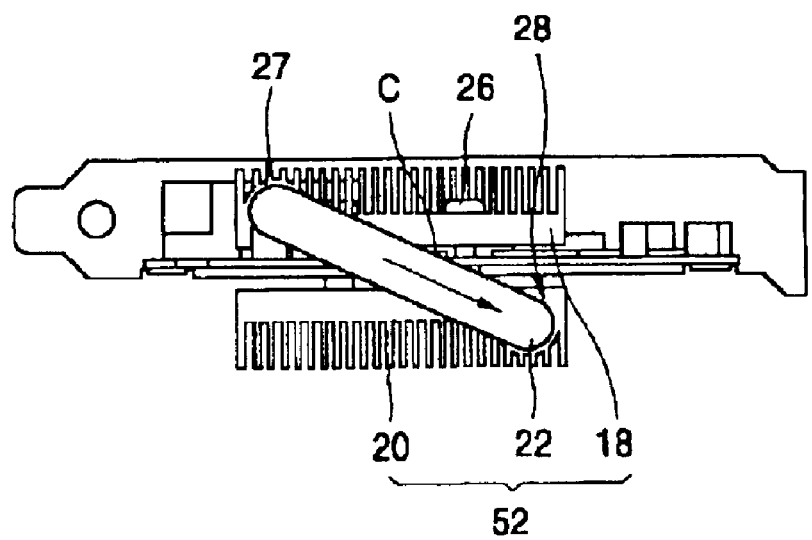
FIG. 4 is a side view of the chipset cooling device in the direction indicated by arrow A in FIG. 3.

FIG. 4 is a side view of the chipset cooling device of the VGA card from the direction indicated by arrow A in FIG. 3. As shown in FIG. 4, an end portion of the heatpipe 22 is inserted into and fixed in the heatpipe insertion hole 27 of the first heatsink 18, and the other end portion is inserted into and fixed in the heatpipe insertion hole 28 of the second heatsink 20. Accordingly, heat generated by the chipset C is primarily dissipated through the first heatsink 18 and conducted to the second heatsink 20 via the heatpipe 22 to also be dissipated through heat-dissipating fins of the second heatsink 20.

As such, since the heat generated from the chipset C is dissipated both through the first and second heatsinks 18 and 20, heat dissipating efficiency is improved.

Figure 5:
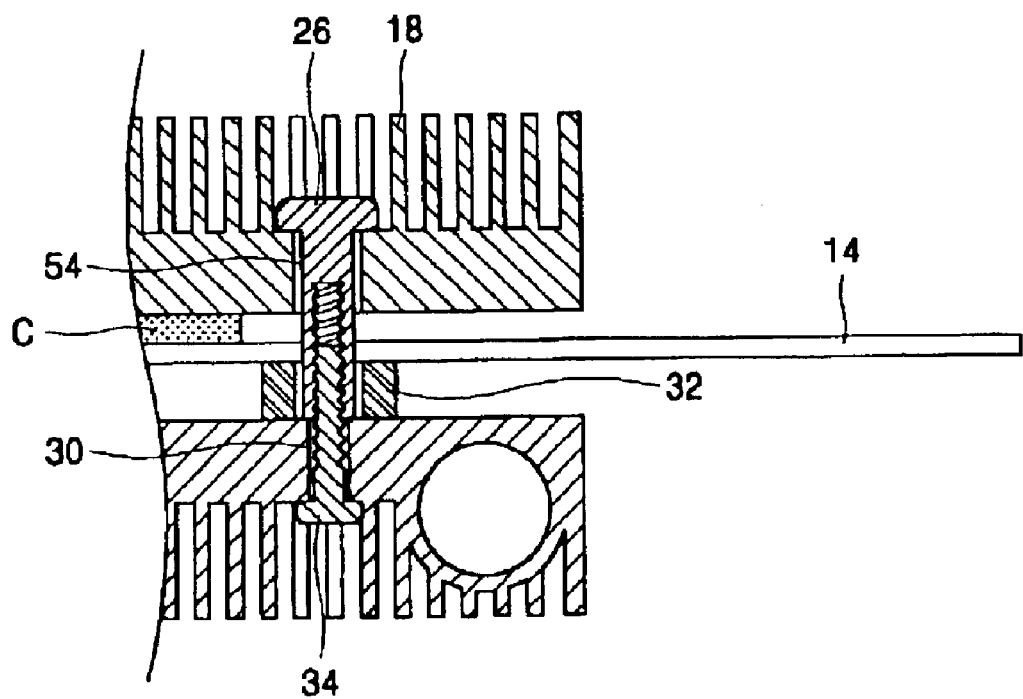
FIG. 5 is a partial sectional view illustrating an example of installation of the chipset cooling device in FIG. 1 according to the present invention on a VGA card.

FIG. 5 is a partial sectional view illustrating an example of installation of the chipset cooling device of the VGA card in FIG. 1 according to the present invention on the PCB 14. Referring to FIG. 5, the internally threaded pin 26 is inserted through the first heatsink 18 and the PCB 14 to protrude out from the bottom of the PCB 14. The internally threaded pin 26 is a known mechanical part with a threaded hole in the axial direction of the pin. The internally threaded pin 26 has a head caught by the pin hole 54.

The coupling bolt 34 is inserted upward through the bolt hole 30 of the second heatsink 20 to screw into the internally threaded pin 26. Prior to coupling between the coupling bolt 34 and the internally threaded pin 26, the spacer 32 is inserted to surround a portion of the internally threaded pin 26 that protrudes out from the bottom of the PCB 14 in order to space the second heatsink 20 apart from the PCB 14 while the coupling bolt 34 engages the internally threaded pin 26.

Figure 6:
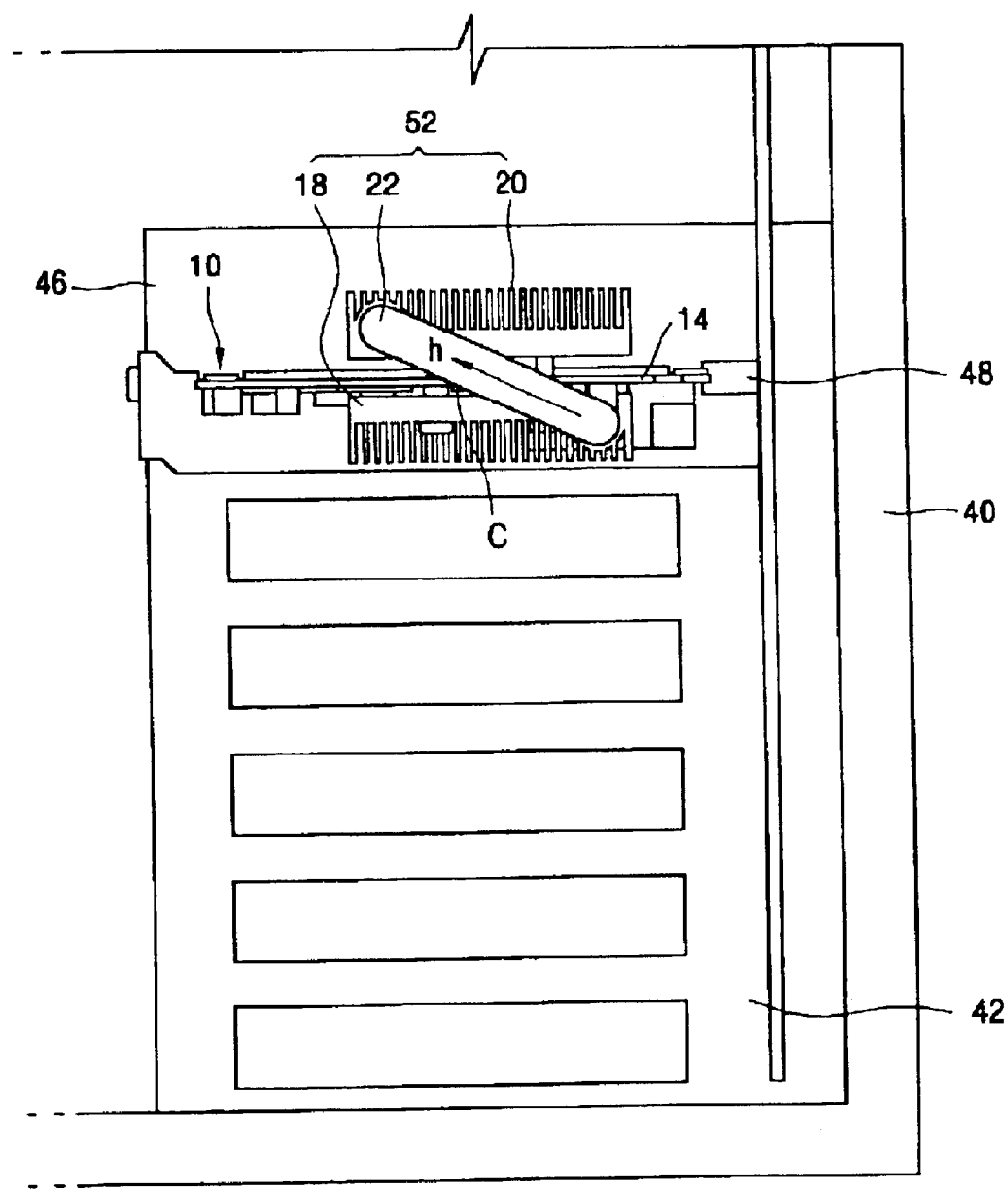
FIGS. 6 and 7 are partial views illustrating a VGA card equipped with the chipset cooling device in FIG. 1 according to the present invention and installed in different types of computer cases.
Figure 7:
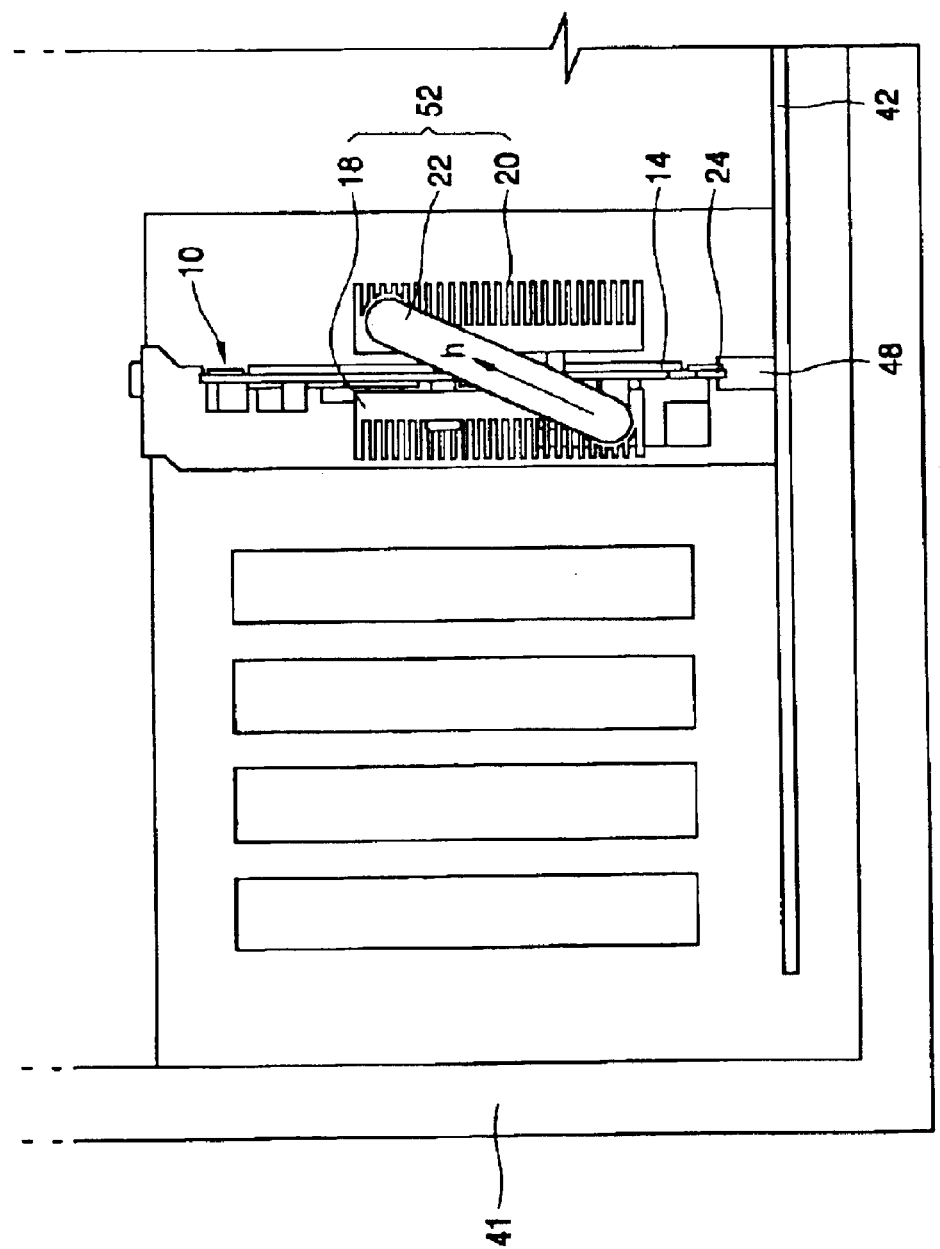

FIGS. 6 and 7 are partial views illustrating a VGA card equipped with the chipset cooling device in FIG. 1 according to the present invention and installed in different types of computer cases. An example of a recently popularized tower style computer case is shown in FIG. 6, and an example of a desk-top computer case is shown in FIG. 7.

Referring to FIG. 6, the mainboard 42 is vertically mounted at and fixed to an inner wall of the computer case 40. The card connection port 48 is formed on a surface of the mainboard 42 facing inside the computer case 40. The card connection port 48, a slot for the connector 24 (shown in FIG. 2) formed on the edge of the PCB 14, connects circuits on the PCB 14 with circuits on the mainboard 42.

The PCB 14 is inserted into the card connection portion 48 and fixed to an installation frame 46 by the installation bracket 12 for stability. The installation frame 46 is a known frame installed at a rear portion of the computer case 40.

The chipset C on the PCB 14 inserted into the card connection portion 48 faces the bottom of the computer case 40. Accordingly, the first heatsink 18 on the chipset C faces downward, and the second heatsink 20 faces upward in the computer case 40.

Such an installation of the PCB 14 allows heat to naturally flow upward from the first heatsink 18 to the second heatsink 20. According to the present invention, based on the fact that heat flows from a lower level to a higher level in a wick type heatpipe, the first heatsink 18, which holds a larger amount of heat than the second heatsink 20, is placed below the second heatsink 20 in order to induce natural heat flow, so that the heat of the first heatsink 18 can be rapidly transferred to the second heatsink 20 via the heatpipe 22.

Although a shorter heat transfer path leads to higher heat conduction efficiency, according to the present invention, the heatpipe 22 is installed slantingly, not vertically to form a short path, as shown in FIG. 6. This installation structure of the heatpipe 22 is considered especially for the application of the chipset cooling device according to the present invention to desk-top computers. As shown in FIG. 7, when the VGA card 10 is vertically mounted in a desk-top computer, heat can be efficiently transferred from the first heatsink 18 to the second heatsink 20 via the heatpipe 22 in an upward direction indicated by arrow "h".

FIG. 7 illustrates a VGA card equipped with the chipset cooling device in FIG. 1 according to the present invention and inserted into a desk-top style computer case. As shown in FIG. 7, the mainboard 42 is horizontally installed on the base of the computer case 41, and the card connection port 48 is on the mainboard 42. The connector 24 of the PCB 14 is coupled to the card connection port 48. The PCB 14 is vertically fixed to the mainboard 42. In FIG. 7, the first heatsink 18 is positioned on the left of the PCB 14, and the second heatsink 20 is positioned on the right of the PCB 14.

The heatpipe 22 connecting the first and second heatsinks 18 and 20 is slanted upward toward the second heatsink 20. According to the same principle described with reference to FIG. 6, heat is allowed to flow upward, from the first heatsink 18 to the second heatsink 20, in the direction indicated by arrow "h".

Figure 8:
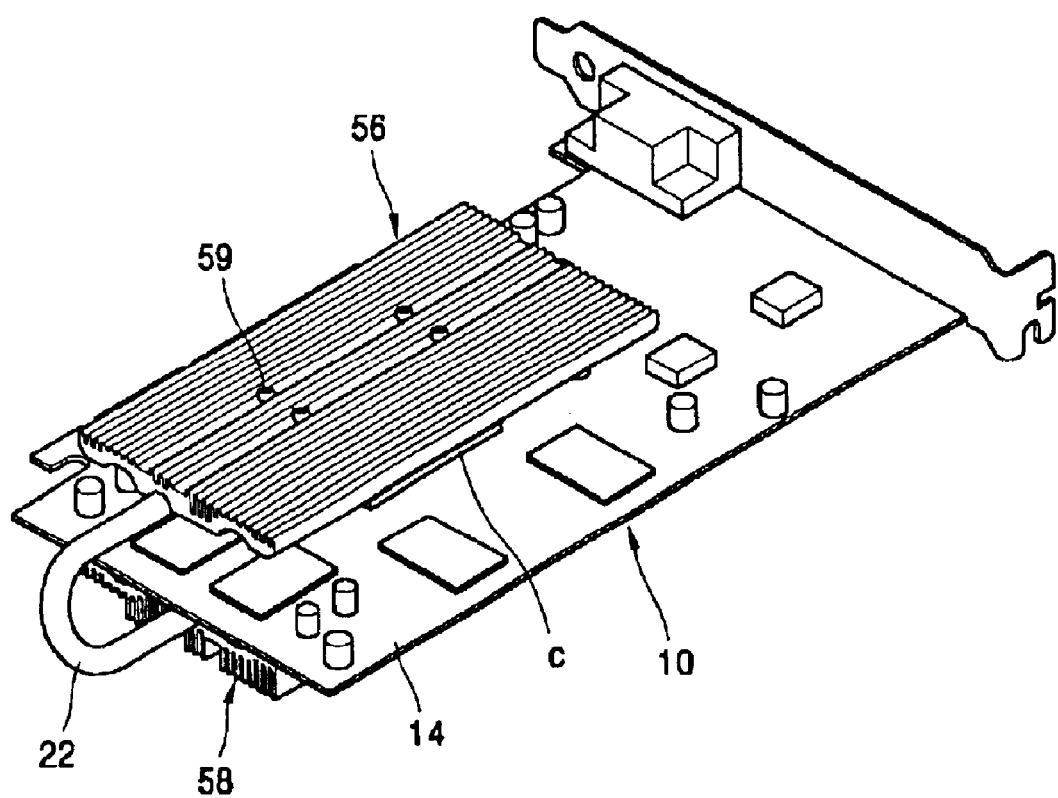
FIG. 8 is a perspective view of a chipset cooling device of a VGA card according to a second embodiment of the present invention installed on a VGA card.

FIG. 8 is a perspective view of a chipset cooling device of a VGA card according to a second embodiment of the present invention installed on a PCB of the VGA. In the chipset cooling devices according to the present and following embodiments of the present invention, heatsinks, which are bound together by the heatpipe, are constructed to be disassembled to allow the heatpipe to connect easily the heatsinks and the positions of the heatsinks with respect to the chipset can be adjusted if necessary.

Descriptions on the same reference numerals as those in the preceding embodiment, which perform the same functions as in the preceding embodiment, will be omitted throughout the present and following embodiments.

Referring to FIG. 8, a chipset cooling device of the VGA card according to the second embodiment of the present invention includes a first heatsink 56, which can be disassembled and is mounted to contact the top of the chipset C on the PCB 14, a second heatsink 58, which can be disassembled and is mounted on the PCB 14 opposite to the first heatsink 56, and a heatpipe 22 connecting the first and second heatsinks 56 and 58.

Figure 9:
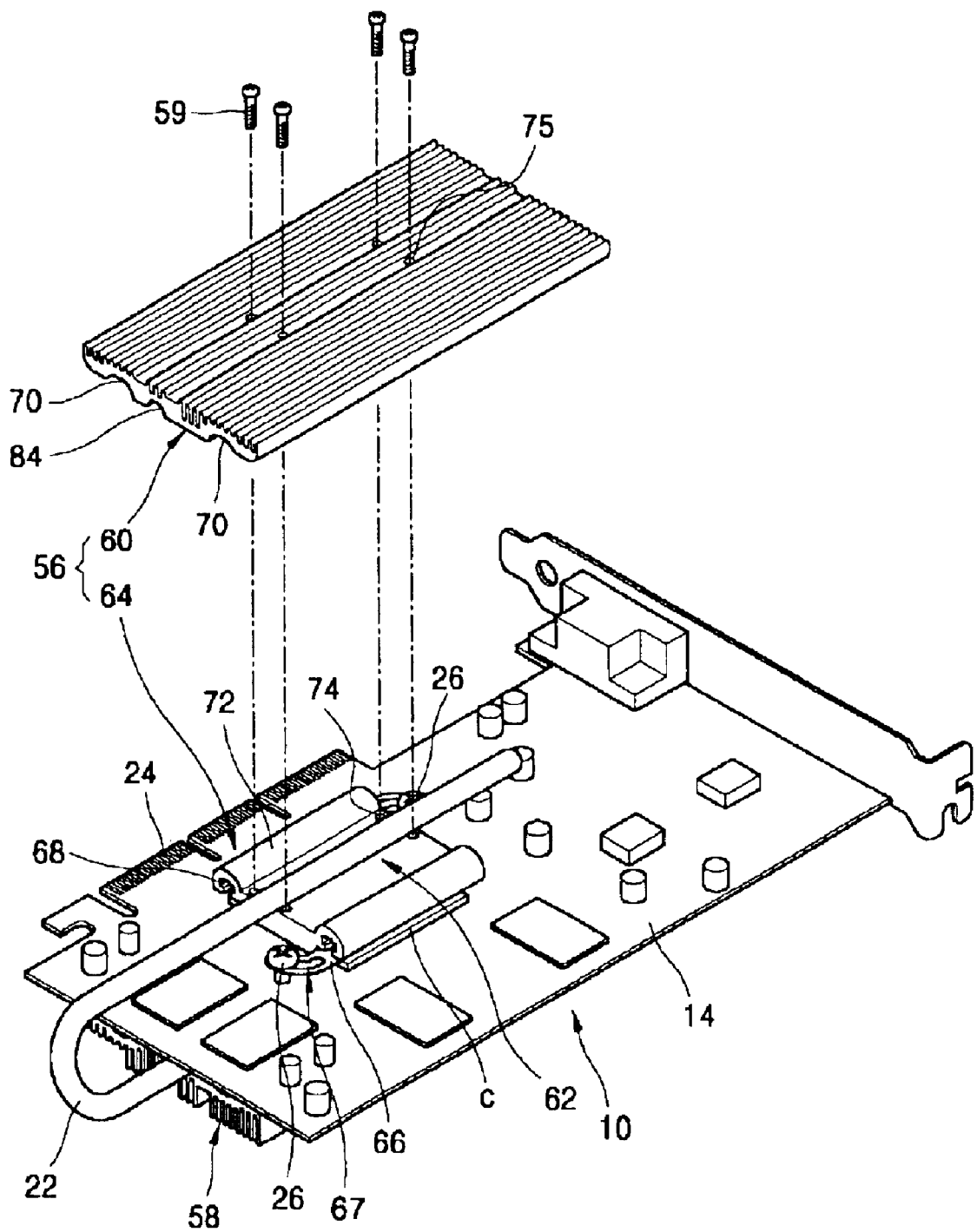
FIG. 9 is a partial exploded view of the chipset cooling device of the VGA card in FIG. 8.

FIG. 9 is a partial exploded view of the chipset cooling device of the VGA card in FIG. 8. Referring to FIG. 9, the first heatsink 56 includes a heat-conducting block 64 in contact with the top of the chipset C to conduct heat generated from the chipset C and a fin plate 60 bound to the heat-conducting block 64 to dissipate heat conducted from the heat-conducting block 64.

Figure 12:
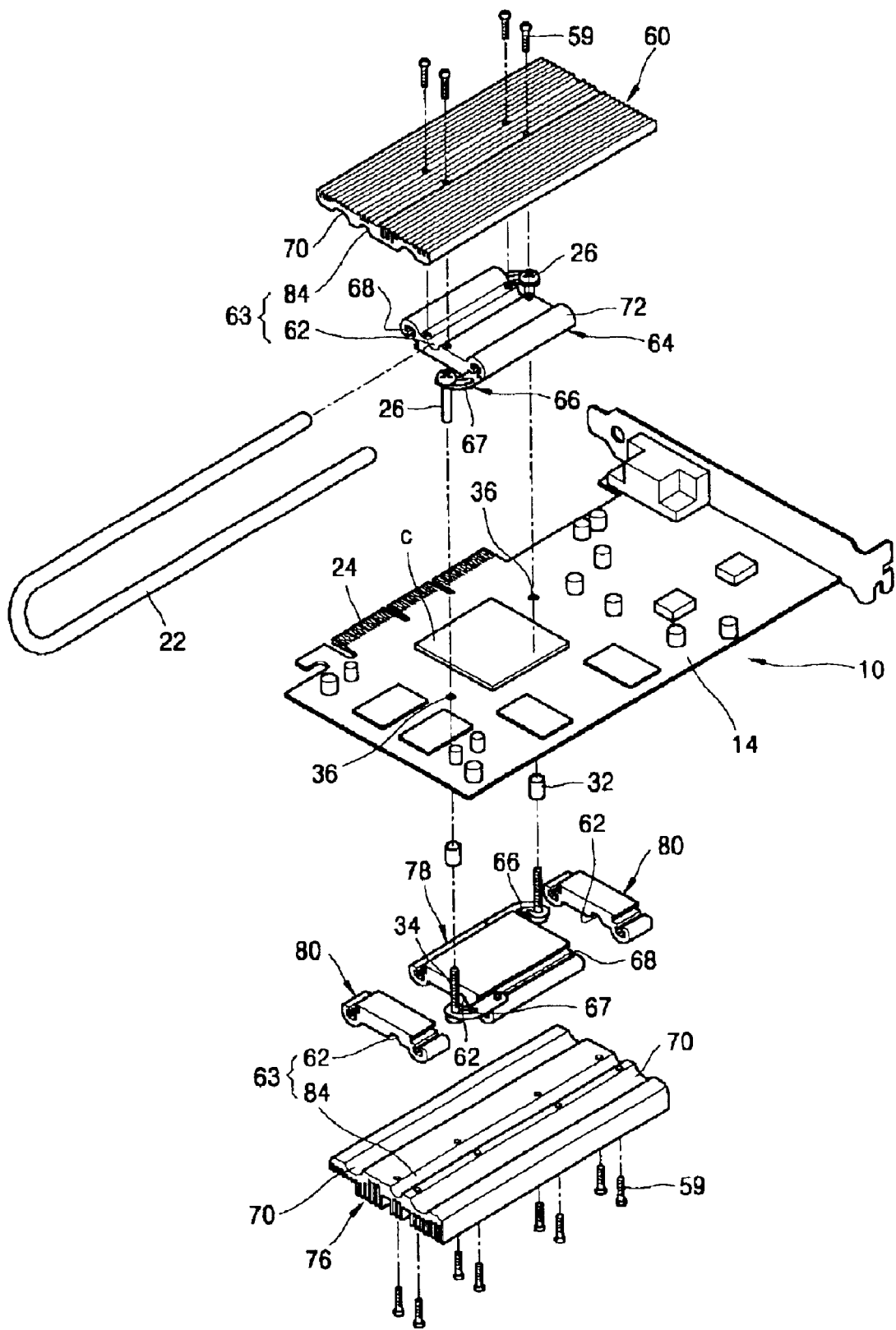
FIG. 12 is an exploded perspective view illustrating the structure of the chipset cooling device of the VGA card in FIG. 8 according to the present invention.

The bottom surface of the heat-conducting block 64 is made to be flat to contact the entire top of the chipset C and is fixed parallel to the PCB 14 by a support bracket 66, the internally threaded pin 26, and the coupling bolt 34 (shown in FIG. 12). Support grooves 68 are formed parallel to one another along opposing bottom edges of the heat-conducting block 64 that do not contact the chipset C. The support grooves 68 are end-opened grooves having a cruciform-like cross-section along the entire length.

Each of the support grooves 68 engages one support bracket 66. The support bracket 66 is a metallic part having a predetermined width and thickness and is fixed parallel to the PCB 14, and having an inner portion engaging the support groove 68. The support bracket 66 can pivot about its inner portion and move along the support groove 68.

Although in the present embodiment the support brackets 66 are diagonally positioned at the heat-conducting block 64, the positions of the support brackets 66 can be changed depending on the positions of the heatsink mounting holes 36 (shown in FIG. 12) in the PCB 14.

Figure 13:
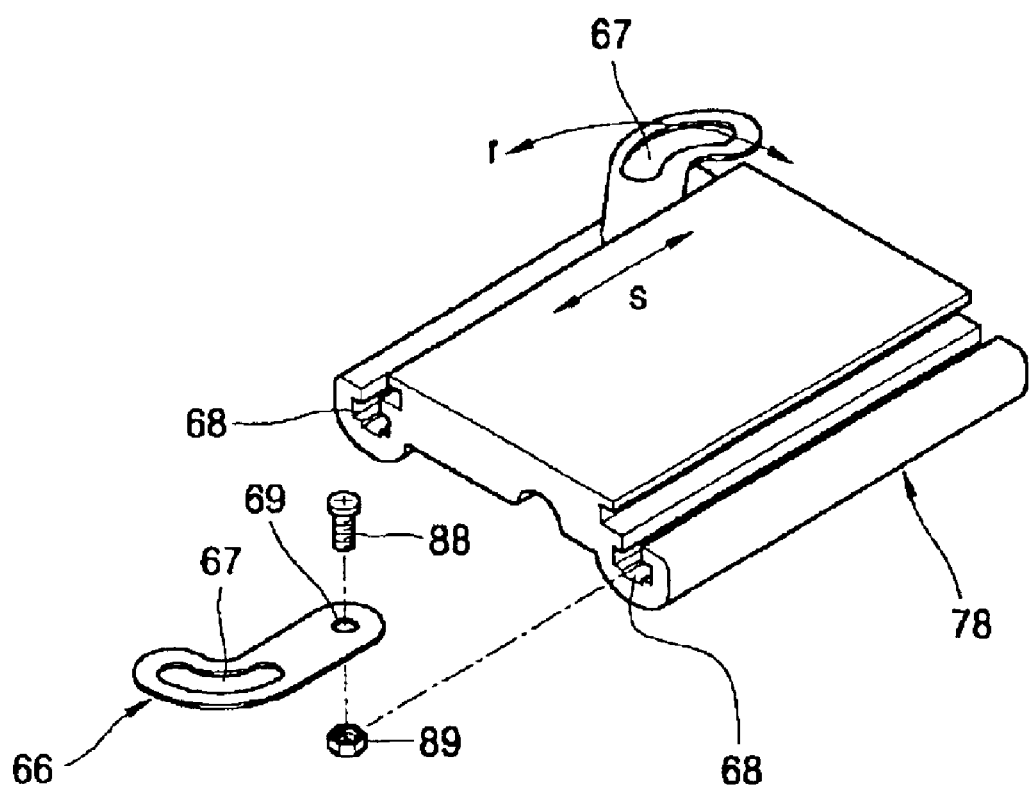
FIG. 13 is a perspective view of a support block in FIG. 12.

A outer portion of the support bracket 66 is curved and has a slot 67, as shown in FIG. 13, in its lengthwise direction. The internally threaded pin 26 is inserted into the slot 67. It will be obvious that the internally threaded pin 26 is movable in and along the slot 57. Since the support bracket 66 is movable with respect to the heat-conducting block 64, and the internally threaded pin 26 is movable along the slot 67, the position of the internally threaded pin 26 which engages the slot 67 is not limited as long as it is near the chipset C.

The positions of the heatsink mounting holes 36 near the chipset C are known to vary depending on the manufacturer of the PCB. However, as described above, by forming the support grooves 68 in the heat-conducting block 64 and applying the support bracket 66 to the support grooves 68, it is possible to simply mount the first and second heatsinks 56 and 58 on any kind of PCB.

The support grooves 68 having the cruciform-like cross-section cause round convex portions 72 to be formed on the top of the heat-conducting block 64 parallel to one another. The round convex portions 72, which are semi-cylindrical, contact round concave portions 70 of the fin plate 60.

A first heatpipe receiving groove 62 (shown in FIG. 12) is formed between the round convex portions 72 on the top of the heat-conducting block 64 to receive and contact the external surface of the heatpipe 22. Since the first heatpipe receiving groove 62 has a semicircular surface, it contacts a semicircumference of the heatpipe 22. The first heatpipe receiving groove 62 is displaced from the center of the heat-conducting block 62 toward the connector 24 parallel to the round convex portions 72.

Four internally threaded holes 74 are formed at the corners of the first heatpipe receiving groove 62.

The fin plate 60, a rectangular plate having a plurality of heat-dissipating fins on its outer surface, is bound to the heat-conducting block 64 by screws 59. The fin plate 60 is spaced apart from the PCB 14 by the total thickness of the chipset C and the heat-absorbing plate 64. Therefore, the size of the fin plate 60 can be increased to maximize the heat-dissipating area without interfering with other parts mounted on the PCB 14.

In an inner surface of the fin plate 60 facing the heat-conducting block 64, two round concave portions 70 and a second heatpipe receiving groove 84 are formed parallel to one another. The round concave portions 70 are fit to the round convex portions 72 of the heat-conducting block 64. Since the round convex portions 72 and the round concave portions 70 contact over their surfaces and are tightened by the screws 59, heat can be fully conducted from the heat-conducting block 64 to the fin plate 60.

The second heatpipe receiving groove 84 having a semi-circular surface, which corresponds to the first heatpipe receiving groove 62, contacts the other semicircumference of the heatpipe 22. When the fin plate 60 is bound to the heat-conducting block 64 with the heatpipe 22 interposed therebetween, the first and second heatpipe receiving grooves 62 and 84 collectively form a cylindrical space which tightens around the external surface of the heatpipe 22 therein.

Four screw holes 75 are formed in the fin plate 60. The screw holes 75 match the internally threaded holes 74 of the heat-conducting block 64, respectively. Therefore, when the heatpipe 22 is positioned between the first and second heatpipe receiving grooves 62 and 84, the fin plate 60 and the heat-conducting block 64 are bound together by inserting the screws 59 into the screw holes 75 and screwing them into the internal threads 74.

Figure 10:
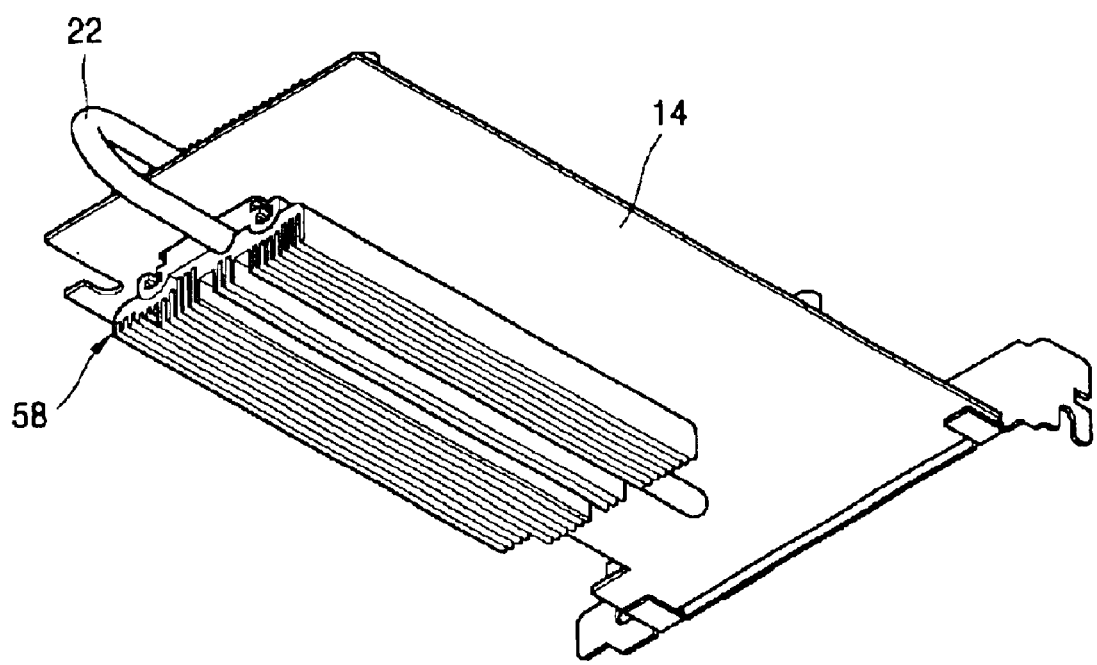
FIG. 10 is a perspective view of the chipset cooling device of the VGA card in FIG. 8 according to the present invention from another angle.

FIG. 10 is a perspective view of the chipset cooling device of the VGA card in FIG. 8 according to the present invention from another angle. Referring to FIG. 10, the second heatsink 58 is connected to the other end portion of the heatpipe 22 spaced apart from the PCB 14. The heatpipe 22 transfers heat from the first heatsink 56 (shown in FIG. 8) to the second heatsink 58, so that the heat is dissipated through both of the first and second heatsinks 56 and 58.

Figure 11:
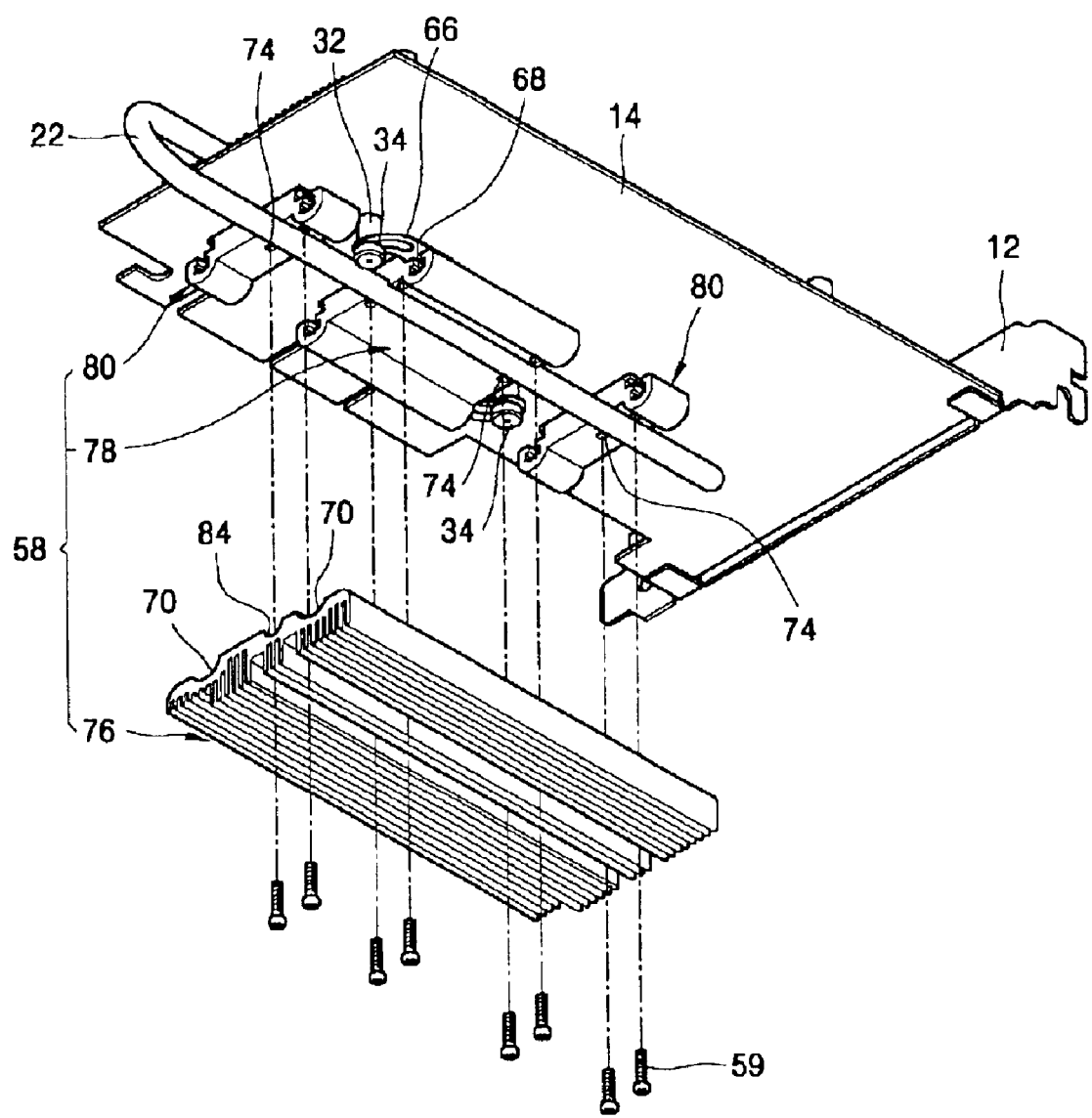
FIG. 11 is a partial exploded perspective view of the chipset cooling device of the VGA card in FIG. 10.

FIG. 11 is a partial exploded perspective view of the chipset cooling device of the VGA card in FIG. 10. Referring to FIG. 11, the other end portion of the second heatpipe 22 extends over the bottom surface of the PCB 14 in the lengthwise direction of the PCB 14. The second heatsink 58 is fixed to the PCB 14 in tight contact with the heatpipe 22.

The second heatsink 58 includes a support block 78, which is directly fixed to the PCB 14, auxiliary support blocks 80, which are located at both sides of the support block 78, and a fin plate 76, which is bound to the support block 78 and the auxiliary support blocks 80.

The support block 78 located between the two auxiliary support blocks 80 is fixed parallel to the PCB 14 by the support bracket 66, the coupling bolts 34, and the spacers 32. The support block 78 and the auxiliary support blocks 80 have a similar shape to the heat-conducting block 64 of the first heatsink 56. Also, the shape of the support bracket 66, which engages the support groove 68 of the support block 78, is the same as that used for the first heatsink 56.

The coupling bolts 34 inserted into the slot 67 of the support bracket 66 are screwed into the internally threaded pins 26 (shown in FIG. 12) protruding out through the heatsink mounting holes 36 (shown in FIG. 12) of the PCB 14. At this time, it will be appreciated that the spacers 32 are coupled to surround the circumferences of the internally threaded pins 26, respectively.

The auxiliary support blocks 80 located at both sides of the support block 78 are coupled only to the fin plate 76, not fixed to the PCB 14, so as to tightly connect the side portions of the heatpipe 22, which are not supported by the support block 78, and the fin plate 76. The auxiliary support blocks 80 are shorter in length but have the same shape as compared with the support block 78.

A plurality of internally threaded holes 74 are formed in the support block 78 and the auxiliary support blocks 78 and 80.

The fin plate 76 is a rectangular plate having a plurality of heat-dissipating fins on its outer surface. Since the fin plate 76 is installed on the bottom surface of the PCB 14 where no parts are mounted, the size of the fin plate 76 can be increased to be large enough to provide a maximum heat-dissipating area. In a surface of the fin plate 76, which is made to contact the entire surface of the support block 78 and auxiliary support blocks 78 and 80, the second heatpipe receiving groove 84 and the round concave portions 70 are formed.

Similar to the first heatsink 56, the fin plate 76 is bound to the support block 78 and the auxiliary support blocks 80 by the screws 59.

FIG. 12 is an exploded perspective view illustrating the structure of the chipset cooling device of the VGA card in FIG. 8 according to the present invention. Referring to FIG. 12, the heat-conducting block 64 and the fin plate 60 are sequentially stacked on the chipset C mounted on the PCB 14 of the VGA card 10. As described above, an end portion of the heatpipe 22 is interposed between the heat-conducting block 64 and the fin plate 60.

An end portion of the heatpipe 22 is positioned between the first and second heatpipe receiving grooves 62 and 84, and the heat-conducting block 64 and the fin plate 60 are bound together by tightly joining the same with the screws 59. When the heat-conducting block 64 and the fin plate 60 are bound together, the first and second heatpipe receiving grooves 62 and 84 form a cylindrical heatpipe insertion hole 63.

The support blocks 78 and 80 and the fin plate 76 are installed on the opposite, bottom surface of the PCB 14. As described above, when the other end portion of the heatpipe 22 is positioned between the first heatpipe receiving grooves 62 of the main and auxiliary support blocks 78 and 80 and the second heatpipe receiving groove 84 of the fin plate 76, the fin plate 76 is tightly bound to the support blocks 70 and 80 by the screws 59.

The auxiliary support blocks 80 push the heatpipe 22 toward the fin plate 76 to ensure tight contact between the heatpipe 22 and the second heatsink 58.

Two heatsink mounting holes 36 are formed near the chipset C in the PCB 14. As described above, the positions of the heatsink mounting holes 36 may slightly vary depending on the manufacturer of the PCB.

An internally threaded pin 26 is inserted into each of the slots 67 of the support brackets 66 whose inner portions engage the respective support grooves 68 of the heat-conducting block 64 to movably support the heat-conducting block 64 against the PCB 14, and the internally threaded pin 26 protrudes underneath the PCB 14 through the heatsink mounting hole 36 of the PCB 14.

The spacer 32 is coupled to surround a portion of the internally threaded pin 26 that protrudes underneath the PCB 14. In this state, the coupling bolt 34 inserted through the slot 67 of the support bracket 66 for the second heatsink 58 is screwed into the internally threaded pin 26.

FIG. 13 is an exploded perspective view of the support block 78 and the support bracket 66 shown in FIG. 12. Although the structure of only the support block 78 is described with reference to FIG. 13, the following description can be referred to for the heat-conducting block 64 because the support block 67 and the heat-conducting block 64 have the same structure.

Referring to FIG. 13, the surface of the support block 78 facing the PCB 14 is made to be flat. The support grooves 68 having a cruciform-like cross-section are formed along two parallel edges of the support block 78.

The slot 67 and a hole 69 are formed at the respective outer and inner portions of the support bracket 66. The support bracket 66 is supported by the support block 78 and is parallel to the PCB 14 and can be rotated through the curve indicated by arrow "r" and moved along the support groove 68, as indicated by arrow "s". The outer portion of the support bracket 66 is curved, and the slot 67 extends along the curvature of the outer portion.

A bolt 88 is inserted through the hole 69 formed at the inner portion of the support bracket 66 to couple to a nut 89. The nut 89 is placed at a predetermined position within the support groove 68 and then tightly coupled to the bolt 88 in order to fix the support bracket 66 at that position.

The nut 89 can be moved along the support groove 68, but cannot rotate in the support groove 68 because it is a hexagonal nut capable of engaging the inner wall of the support groove 68 having the cruciform-like cross-section.

For example, after the bolt 88 is inserted into the hole 69 of the support bracket 66 and then loosely coupled to the nut 89, the nut 89 is slid into the support groove 68 to a desired position, and the bolt 88 is tightened to fix the support bracket 66 at that position of the support groove 68.

When there is a need to change the position of the support bracket 66, the bolt 88 is slightly loosened from the nut 89 to allow the support bracket 66 to be moved in the direction indicated by arrow "s" or to be rotated through the curve indicated by arrow "r" to a desired position, and the bolt 88 is tightened to fix the support bracket 66 at that position.

Therefore, although the positions of the heatsink mounting holes 36 (shown in FIG. 12) may vary for different kinds of PCBs, the chipset cooling device according to the present invention can be applied to any kind of PCB by adjusting the position of the support bracket 66.

Figure 14:
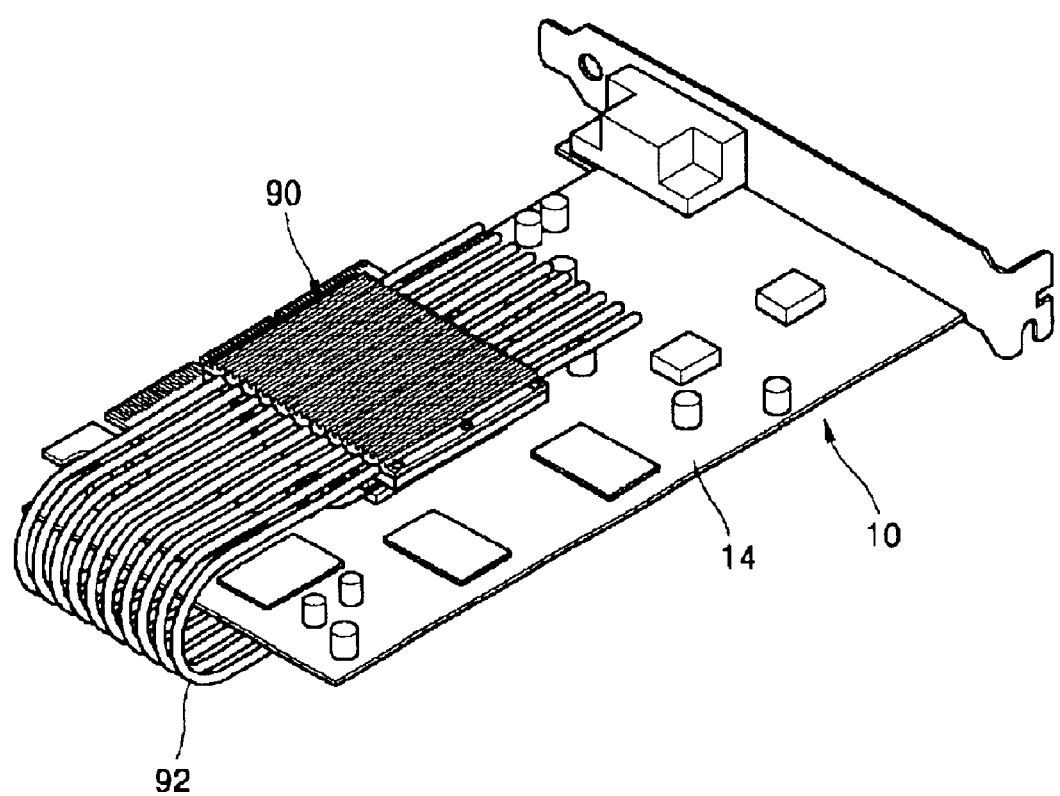
FIG. 14 is a perspective view of a chipset cooling device of a VGA card according to a third embodiment of the present invention mounted on a VGA card.

FIG. 14 is a perspective view of a chipset cooling device of a VGA card according to a third embodiment of the present invention mounted on a VGA card. Referring to FIG. 14, the chipset cooling device of the VGA card according to third embodiment of the present invention includes a first heatsink 90 to be mounted in contact with the chipset C on the PCB 14 and having a plurality of heatpipe receiving grooves 98 and 99 (shown in FIG. 15), a second heatsink 105 (shown in FIG. 15) mounted on a surface of the PCB 14 opposite to the first heatsink 90 with a separation gap between the second heatsink 105 and the PCB 14, and a plurality of heatpipes 92 connecting the first and second heatsinks 90 and 105.

Figure 15:
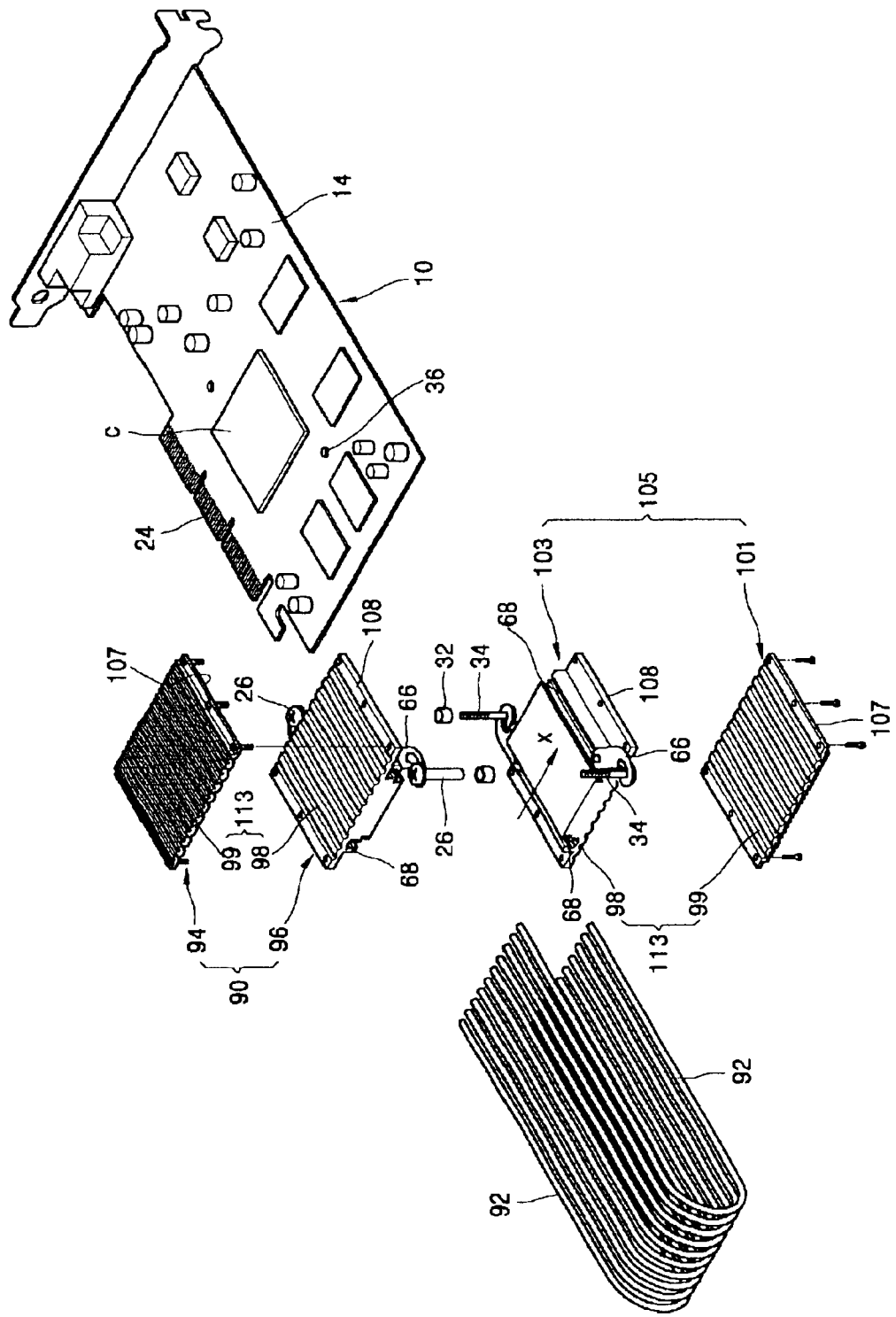
FIG. 15 is an exploded perspective view of the chipset cooling device of the VGA card in FIG. 14 according to the present invention.
Figure 19:
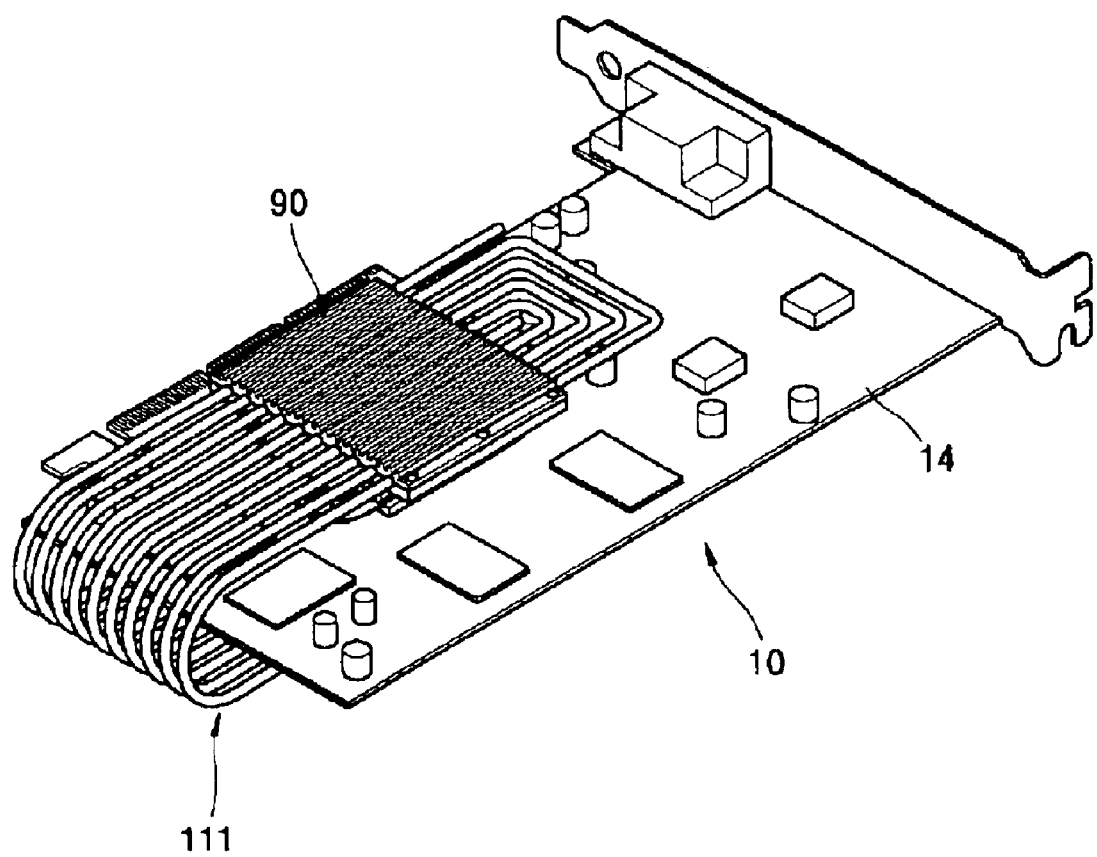
FIG. 19 is a perspective view of a modification of the chipset cooling device of the VGA card in FIG. 17 according to the present invention.

FIG. 15 is an exploded perspective view of the chipset cooling device in FIG. 14 according to the present invention disassembled from the VGA card. Referring to FIG. 19, the first heatsink 90 includes a heat-conducting block 96 having a bottom contacting the chipset C mounted on the PCB 14 and a plurality of first heatpipe receiving grooves 98 arranged parallel to one another on its top surface, and a fin plate 94 bound to the heat-conducting block 96, which has a plurality of second heatpipe receiving grooves 99 on its bottom surface to correspond to the first heatpipe receiving grooves 98 and which has a plurality of heat-dissipating fins on its top surface.

Two support grooves 68 are formed parallel to one another along opposing bottom edges of a chipset contact region of the heat-conducting block 96 so as not to contact the chipset C. A support bracket 66 is inserted to be movable into each of the support grooves 68.

The first heatpipe receiving grooves 98 correspond with the second heatpipe receiving grooves 99, and each of the first and second heatpipe receiving grooves 98 and 99 has a semicircular surface. The depth of each of the first and second heatpipe receiving grooves 98 and 99 is equal to the radius of a heatpipe 92. As the heat-receiving block 96 and the fin plate 94 are bound together, a plurality of heatpipe insertion holes 113 which receive the heatpipes 92 are formed by the first and second heatpipe receiving grooves 98 and 99. When an end portion of each of the heatpipes 92 is placed on the respective first heatpipe receiving grooves 98, the fin plate 94 is bound to the heat-conducting block 96. In this way, the first heatsink 90 is assembled with the heatpipe 92.

For the coupling of the fin plate 94 and the heat-conducting block 96, both the fin plate 94 and the heat-conducting block 96 have coupling edge portions 107 and 108 along their parallel edges. The coupling edge portions 107 and 108 are made to contact with one another and then tightened up by a plurality of screws.

The second heatsink 105 has the same configuration as the first heatsink 90.

The binding structures of the first and second heatsinks 90 and 105 to the PCB 14 are the same as in the second embodiment described with reference to FIG. 8.

In the present embodiment, a total of ten heatpipes 92 which are equal in size and extend parallel to one another are used. The function of the heatpipes 92 is the same as in the above embodiments described with reference to FIGS. 1 and 8.

Figure 16:
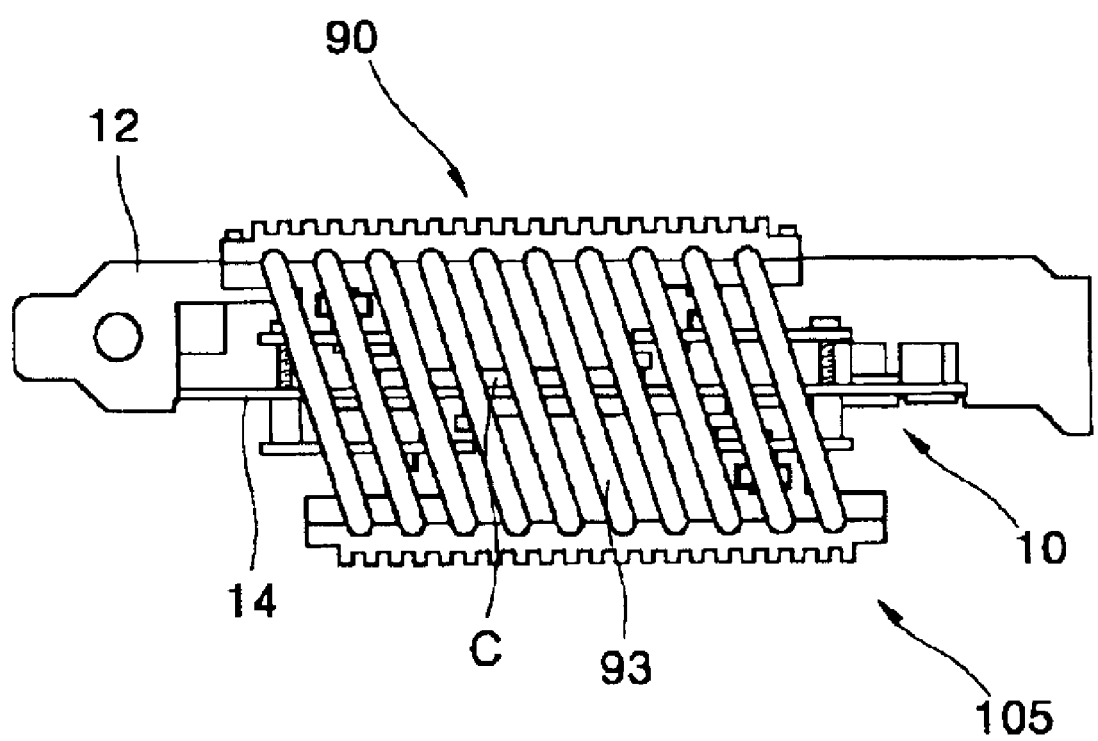
FIG. 16 is a side view of the chipset cooling device of the VGA card according to the third embodiment of the present invention having a different type of heatpipe arrangement to the heatpipe of FIG. 14.

FIG. 16 is a side view of the chipset cooling device of the VGA card according to the third embodiment of the present invention having a different type of heatpipe arrangement to the heatpipe of FIG. 14. Referring to FIG. 16, a plurality of heatpipe 93 are connected between the first heatsink 90 and the second heatsink 105, and the second heatsink 105 is shifted to the right in FIG. 16.

This parallel shifting of the position of the second heatsink 105 can be achieved by adjusting the position of the support bracket 66 in each of the support grooves 68 and the binding position of the internally threaded pin 26 and the coupling bolt 34 in each of the slots 67.

Figure 17:
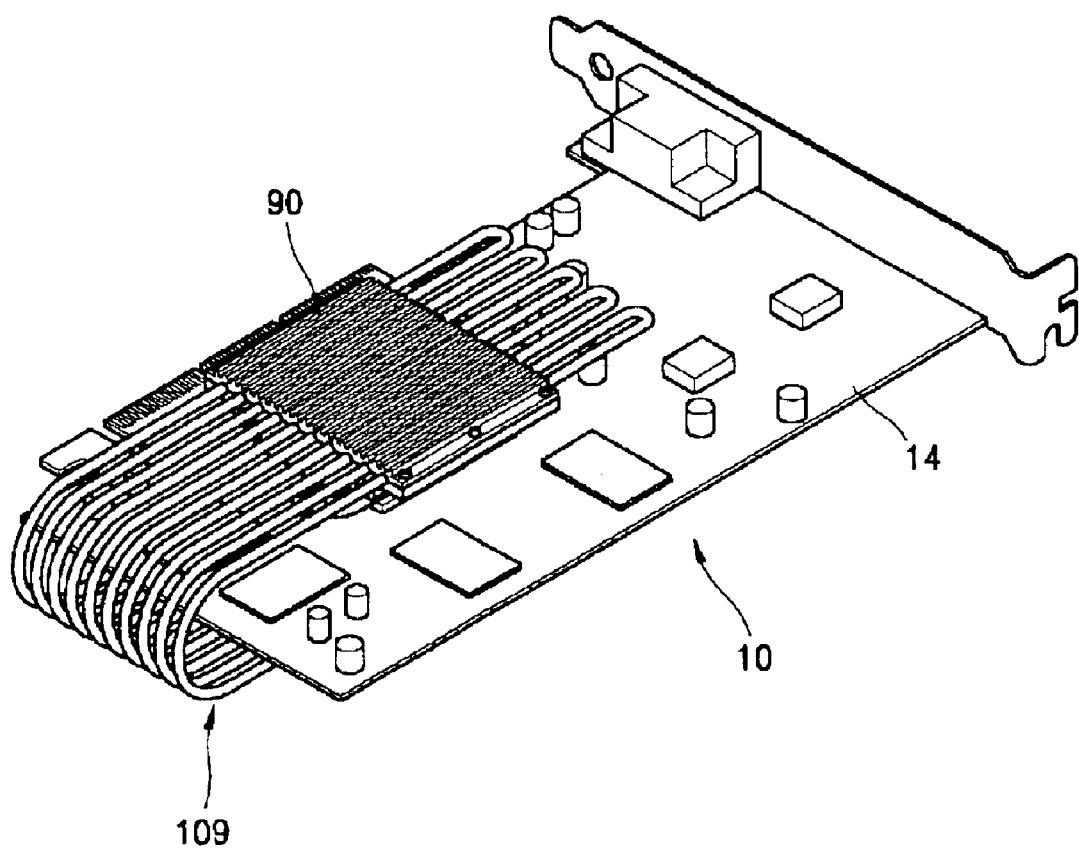
FIG. 17 is a perspective view of a chipset cooling device of a VGA card according to a fourth embodiment of the present invention mounted on a VGA card.

FIG. 17 is a perspective view of a chipset cooling device of a VGA card according to a fourth embodiment of the present invention mounted on the VGA card. As shown in FIG. 17, in this embodiment a chipset cooling device includes a single heatpipe 109 connecting the first and second heatsinks 90 and 105 (shown in FIG. 18), wherein the single heatpipe 109 is folded in a pattern. A known micro heatpipe may be used for the heatpipe 109 according to the present embodiment. The micro heatpipe, known not to include a wick, can be used without considering the direction in which the heatpipe extends.

Figure 18:
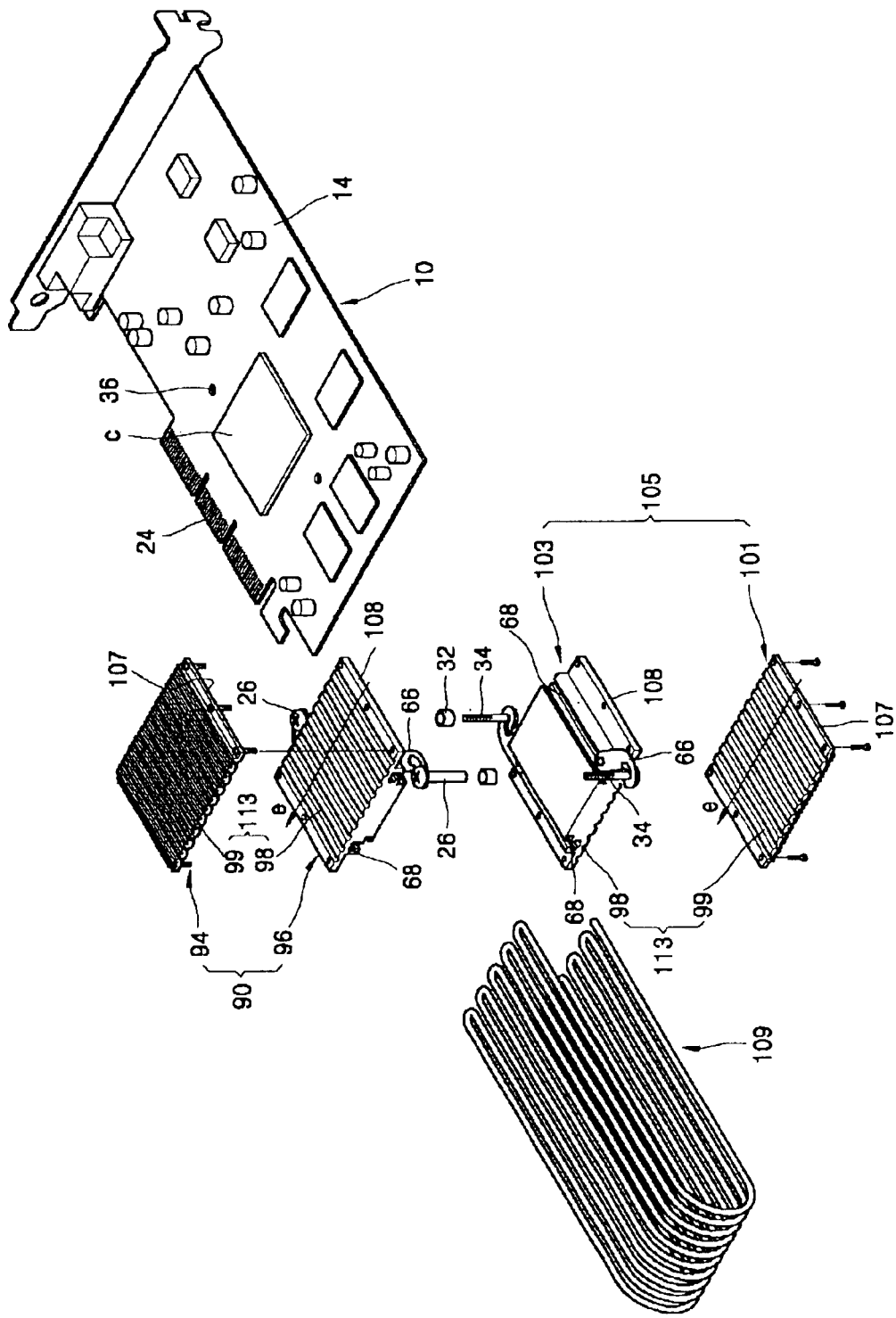
FIG. 18 is an exploded perspective view of the chipset cooling device of the VGA card in FIG. 17 according to the present invention.

FIG. 18 is an exploded perspective view of the chipset cooling device of the VGA card in FIG. 17 according to the present invention disassembled from the VGA card. As shown in FIG. 18, the heatpipe 109 is folded to extend alternately over the first and second heatsinks 90 and 105 and to connect the first and second heatsinks 90 and 105. The heatpipe 109 is positioned to fit to and is then tightened up in the heatpipe insertion holes 113 formed by the first and second heatpipe receiving grooves 98 and 99. The heatpipe 109 basically has a function to transfer heat from the first heatsink 90 to the second heatsink 105.

The heatpipe 109 is formed by folding a single straight heatpipe in a pattern so as to alternately extend between the first and second heatsinks 90 and 105 and pass through each of the heatpipe insertion holes 113 formed by the first and second heatpipe receiving grooves 98 and 99 in the direction indicated by arrow "e".

For example, in a state where an end portion of the heatpipe 109 is fixed in an outermost heatpipe insertion hole 113 of the second heatsink 105, the heatpipe 109 is folded upward and to extend over an outermost heatpipe insertion hole 113 of the first heatsink 90, folded laterally in a U-shape to extend over the next heatpipe insertion hole 113 of the first heatsink 90, folded downward and to extend over the next heatpipe insertion hole 113 of the second heatsink 105, and folded laterally in a U-shape to extend over the next heatpipe insertion hole 113 of the second heatsink 105.

Figure 20:
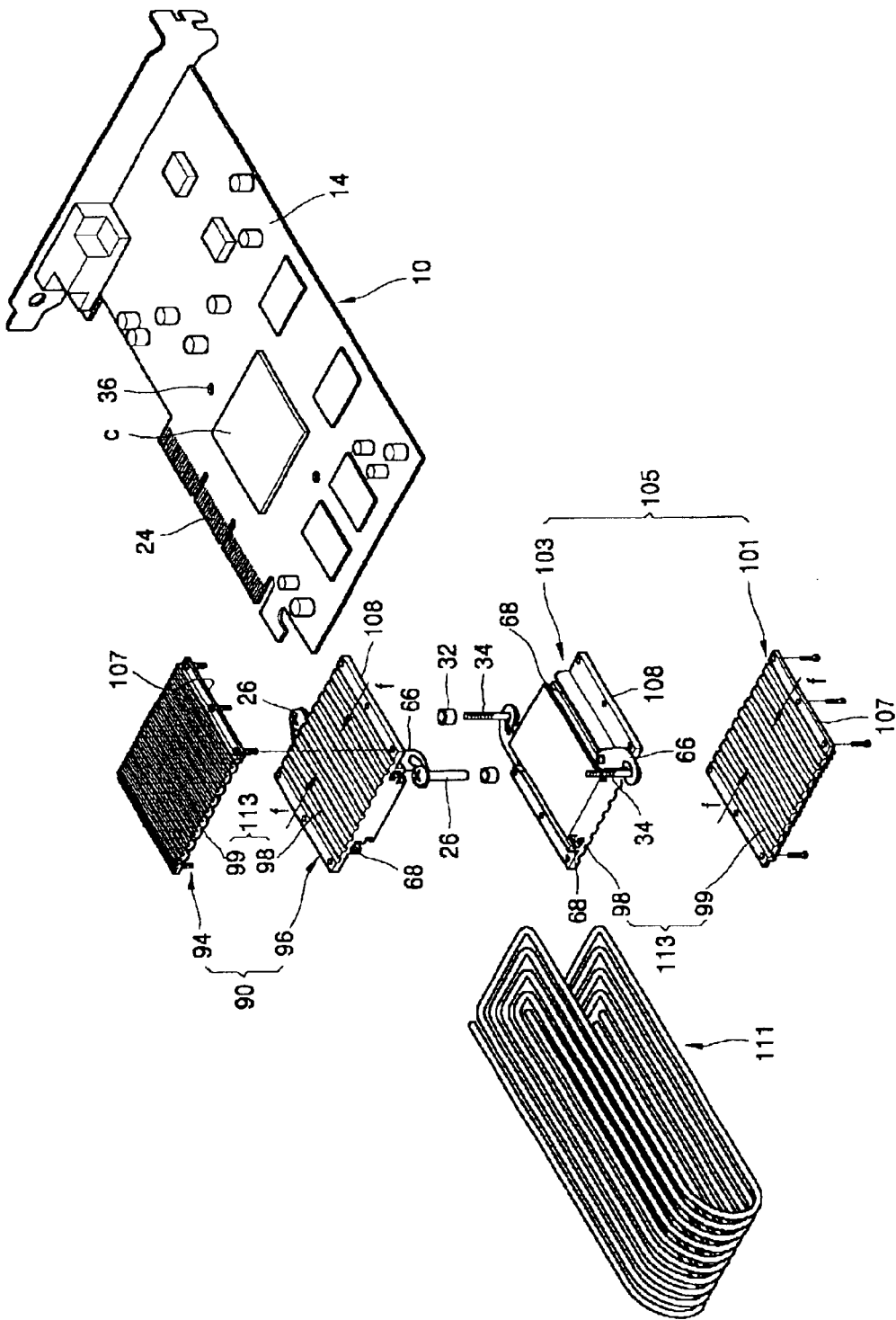
FIG. 20 is an exploded perspective view of the chipset cooling device of the VGA card in FIG. 19.

FIG. 19 is a perspective view of a modification of the chipset cooling device of the VGA card in FIG. 17 according to the present invention. FIG. 20 is an exploded perspective view of the chipset cooling device of the VGA card in FIG. 19 disassembled from the VGA card.

Referring to FIGS. 19 and 20, in this embodiment a single heatpipe 111 is folded to connect the first and second heatsinks 90 and 105 and extend alternately between the first and second heatsinks 90 and 105. The heatpipe 111 basically has a function to transfer heat from the first heatsink 90 to the second heatsink 105.

The heatpipe 111 is the same as the heatpipe 109 shown in FIG. 18 in that it is made from a single straight heatpipe, but has a different folding pattern to the heatpipe 109. In particular, the heatpipe 111 is formed by folding a single straight heatpipe in a pattern so as to extend alternately between the first and second heatsinks 90 and 105 and pass through each of the heatpipe insertion holes 113 formed by the first and second heatpipe receiving grooves 98 and 99 in the direction indicated by arrow "f".

The shape of the heatpipe for a chipset cooling device according to the present invention can be varied as long as it extends alternately between the first and second heatsinks 90 and 105 and it passes through all of the heatpipe insertion holes 113 formed by the first and second heatpipe receiving grooves 98 and 99.

Since the heatpipes 109 and 111 in this embodiment are implemented with micro heatpipes, it is possible to transfer heat from the first heatsink 90 to the second heatsink 105 rapidly regardless of the position of the chipset cooling device, even when the binding portion of the heatpipe 109 (111) and the first heatsink 90 is not lower than the binding portion of the heatpipe 109 (111) and the second heatsink 105.

Figure 21:
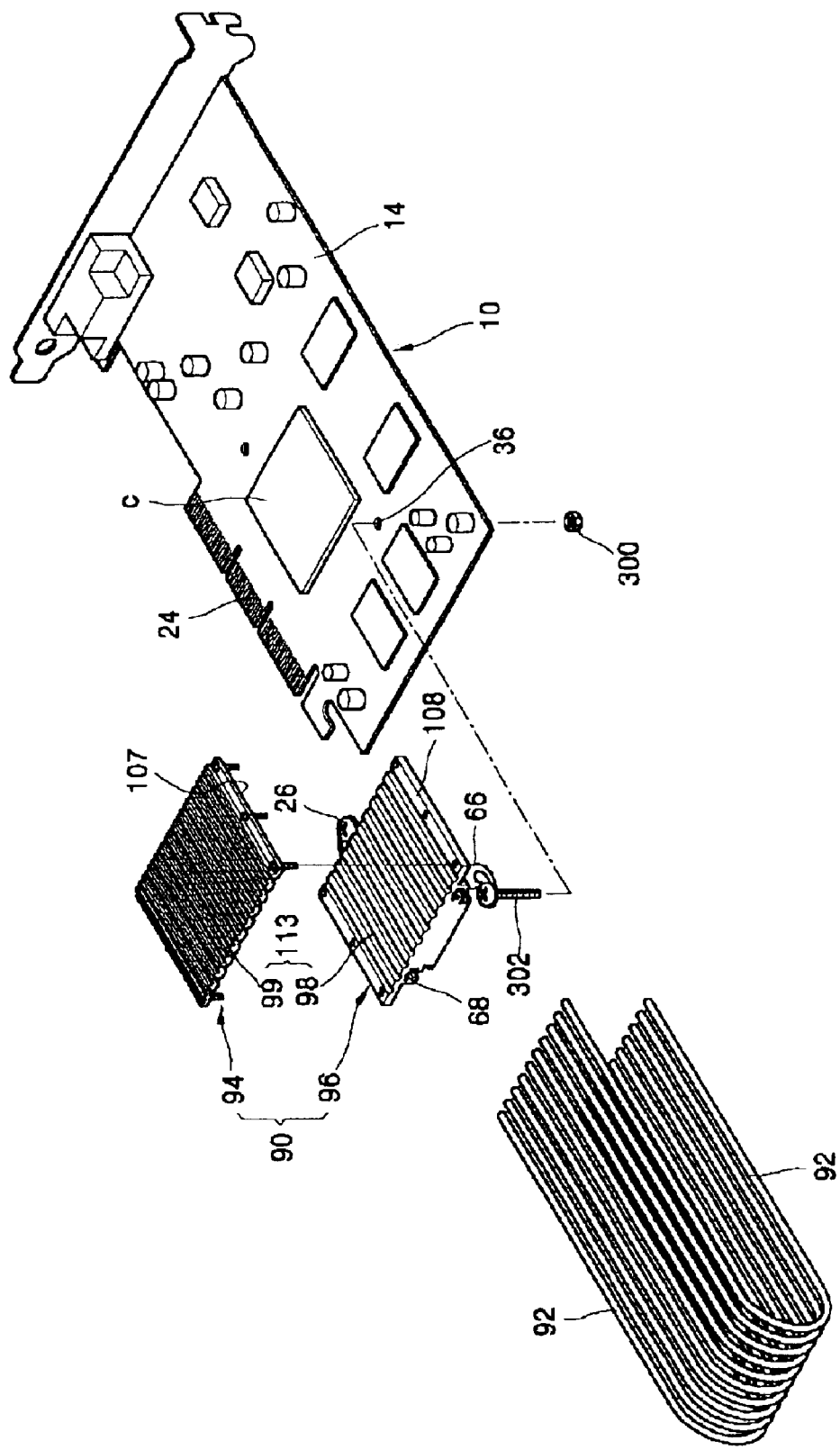
FIG. 21 is an exploded perspective view of a chipset cooling device of a VGA card according to a fifth embodiment of the present invention.

FIG. 21 is an exploded perspective view of a chipset cooling device of a VGA card according to a fifth embodiment of the present invention disassembled from the VGA card. A chipset cooling device of a VGA card according to the fifth embodiment of the invention basically has the same structure as the chipset cooling device according to the above-described third embodiment, but does not include the second heatsink.

Referring to FIG. 21, a chipset cooling device of a VGA card according to the fifth embodiment of the present invention includes a first heatsink 90 mounted to contact the top of a chipset C and a plurality of U-shape heatpipes 92, wherein an end portion of the heatpipes 92 is fixed to the first heatsink 90, and the other end portion thereof extends below a PCB 14 parallel to one another.

The first heatsink 90 is installed on the PCB 14 by a bolt 302 and a nut 300. The bolt 302 is inserted through the slot 67 of the support bracket 66 and then into the heatsink mounting hole 36 of the PCB 14 and screwed into the nut 300 at the bottom surface of the PCB 14.

In a chipset cooling device having the structure described in the above fifth embodiment, heat generated by the chipset C is dissipated through both the first heatsink 90 and the heatpipes 92. In other words, the heatpipes 92 as well as the fin plate 94 dissipate the heat conducted to the heat-conducting block 96 from the chipset C, thereby increasing the cooling efficiency of the first heatsink 90.

Figure 22:
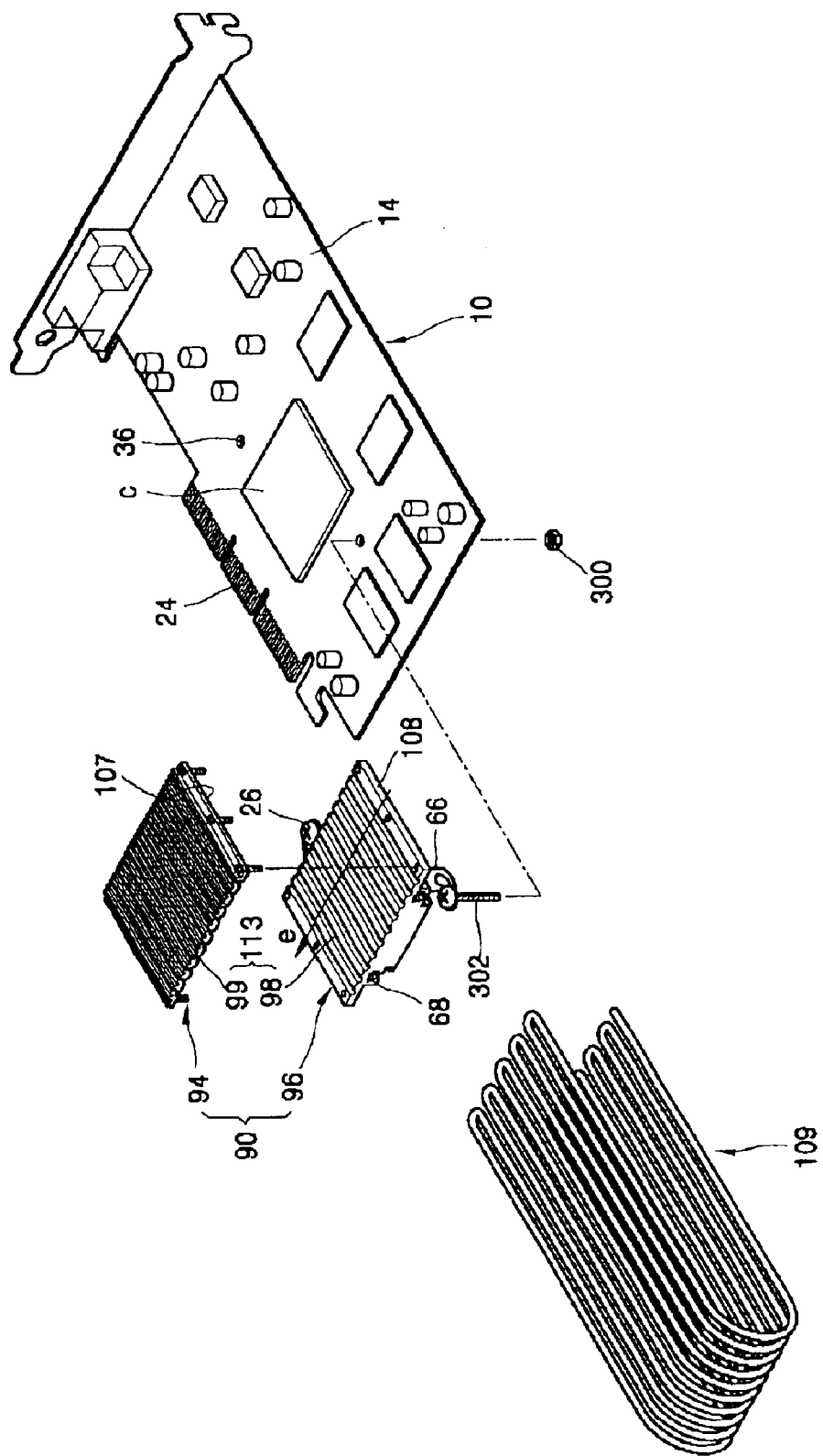
FIG. 22 is an exploded perspective view of a chipset cooling device of a VGA card according to a sixth embodiment of the present invention.

FIG. 22 is an exploded perspective view of a chipset cooling device of a VGA card according to a sixth embodiment of the present invention, which is the same as the chipset cooling device according to the fourth embodiment except that the second heatsink is removed.

Referring to FIG. 22, a heatpipe 109 is fixed to only the first heatsink 90. The heatpipe 109 is comprised of a pipe folded back and forth to make a series of U-shaped parallel spans which extend above and below the PCB 14, wherein a portion of the heatpipe 109 which extends above the PCB 14 engages the first heatsink 90.

Heat generated by the chipset C is conducted to the heat-conducting block 96 and dissipated through the pin plate 94 and the heatpipe 109, so that the chipset C is efficiently cooled.

Figure 23:
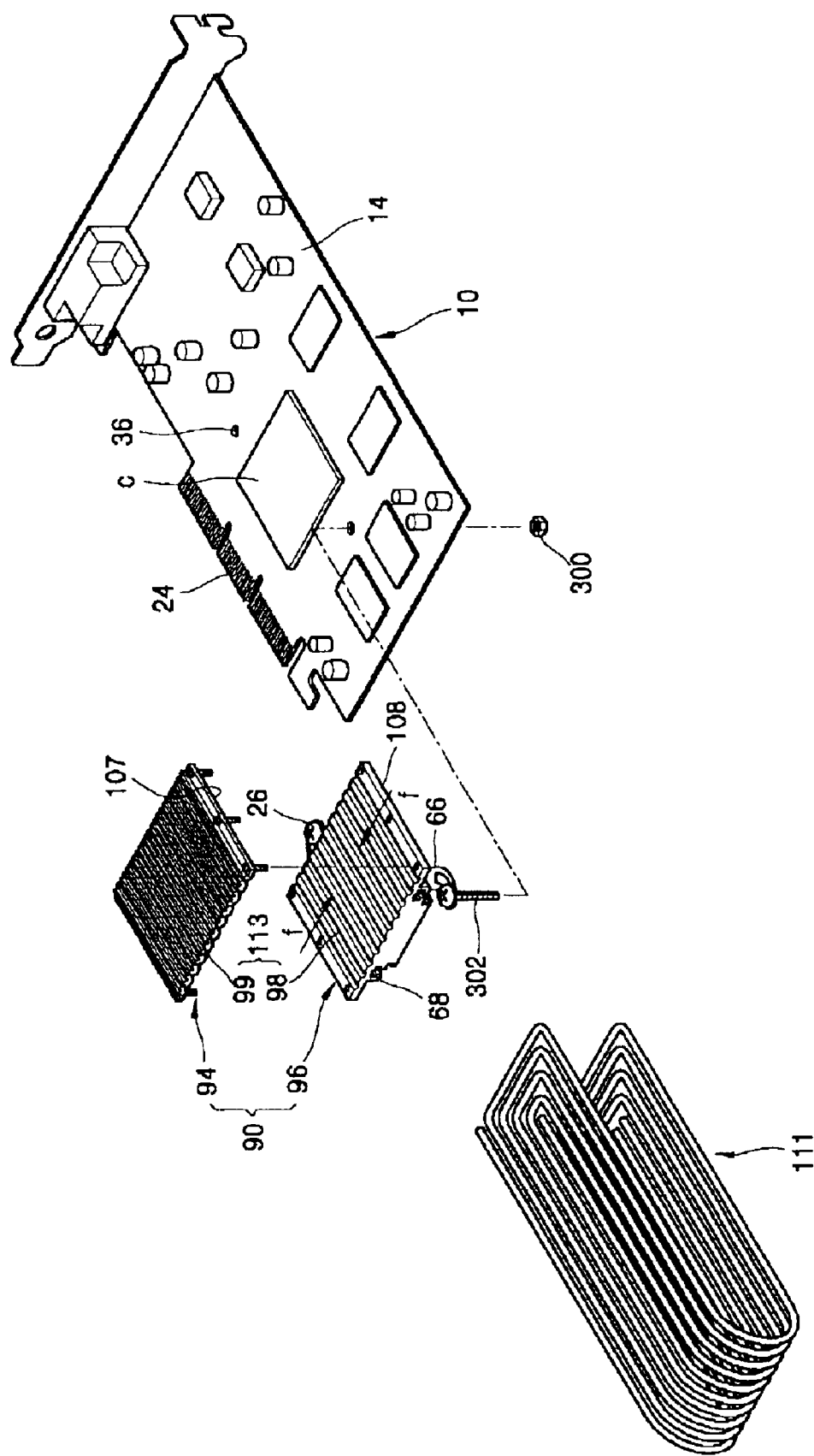
FIG. 23 is an exploded perspective view of a modification of the chipset cooling device of the VGA card in FIG. 22 having a different type of a heatpipe.

FIG. 23 is an exploded perspective view of a modification of the chipset cooling device of the VGA card according to the sixth embodiment having a different type of a heatpipe, which is the same as the chipset cooling device of FIG. 20 except that the second heatsink 105 is removed.

Referring to FIG. 23, a heatpipe 111 is folded in a rectangular spiral pattern to make a series of U-shaped parallel spans which extends above and below the PCB 14, wherein a portion of the heatpipe 111 which extends above the PCB 14 is tightly fixed to the first heatsink 90. Heat generated by the chipset C is dissipated through the heatpipe 111 as well as the fin plate 94, so that the chipset C is efficiently cooled, as described above.

Figure 24:
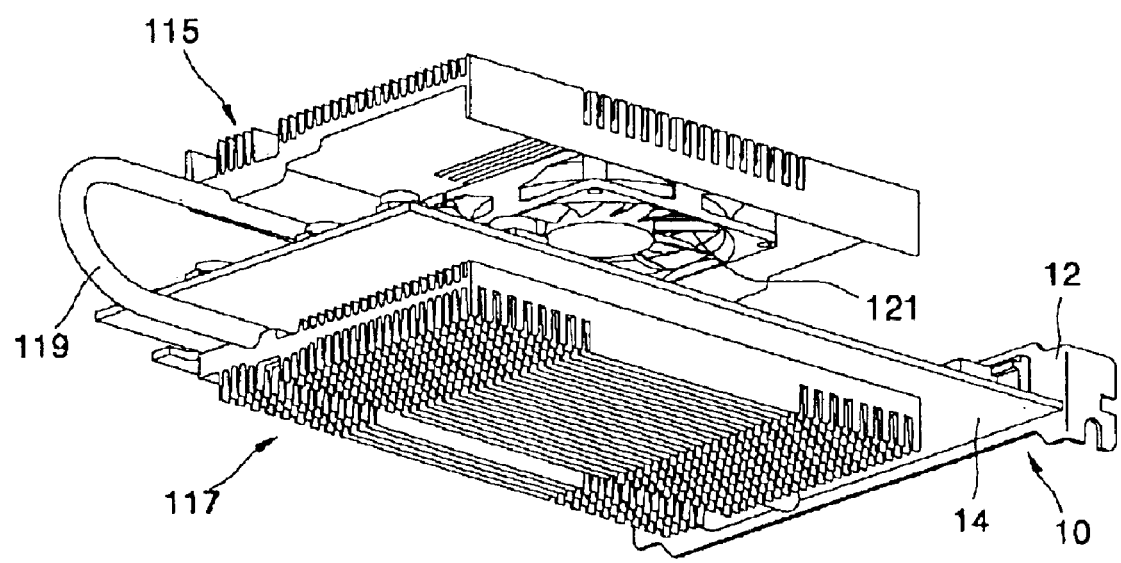
FIG. 24 is a perspective view of a chipset cooling device of a VGA card according to a seventh embodiment of the present invention.

FIG. 24 is a perspective view of a chipset cooling device of a VGA card according to a seventh embodiment of the present invention.

The seventh and following embodiments of the present invention are based on the idea that the cooling efficiency of a heatsink would be increased by supplying cool air to the heatsink. In the embodiments according to the present invention, a cooling fan for a heatsink is rotated constantly at a low speed of 2000 rpm, which hardly generates noise.

Referring to FIG. 24, a chipset cooling device of a VGA card according to the seventh embodiment of the present invention includes a first heatsink 115 mounted to contact the top of a chipset C (see FIG. 25) of a VGA card 10 to dissipate heat generated by the chipset C, a second heatsink 117 mounted on the bottom surface of the PCB 14 opposite to the first heatsink 115, a heatpipe 119 connecting the first heatsink 115 and the second heatsink 117, and a cooling fan 121 mounted on the first heatsink 115 to supply cool air to the same.

Figure 25:
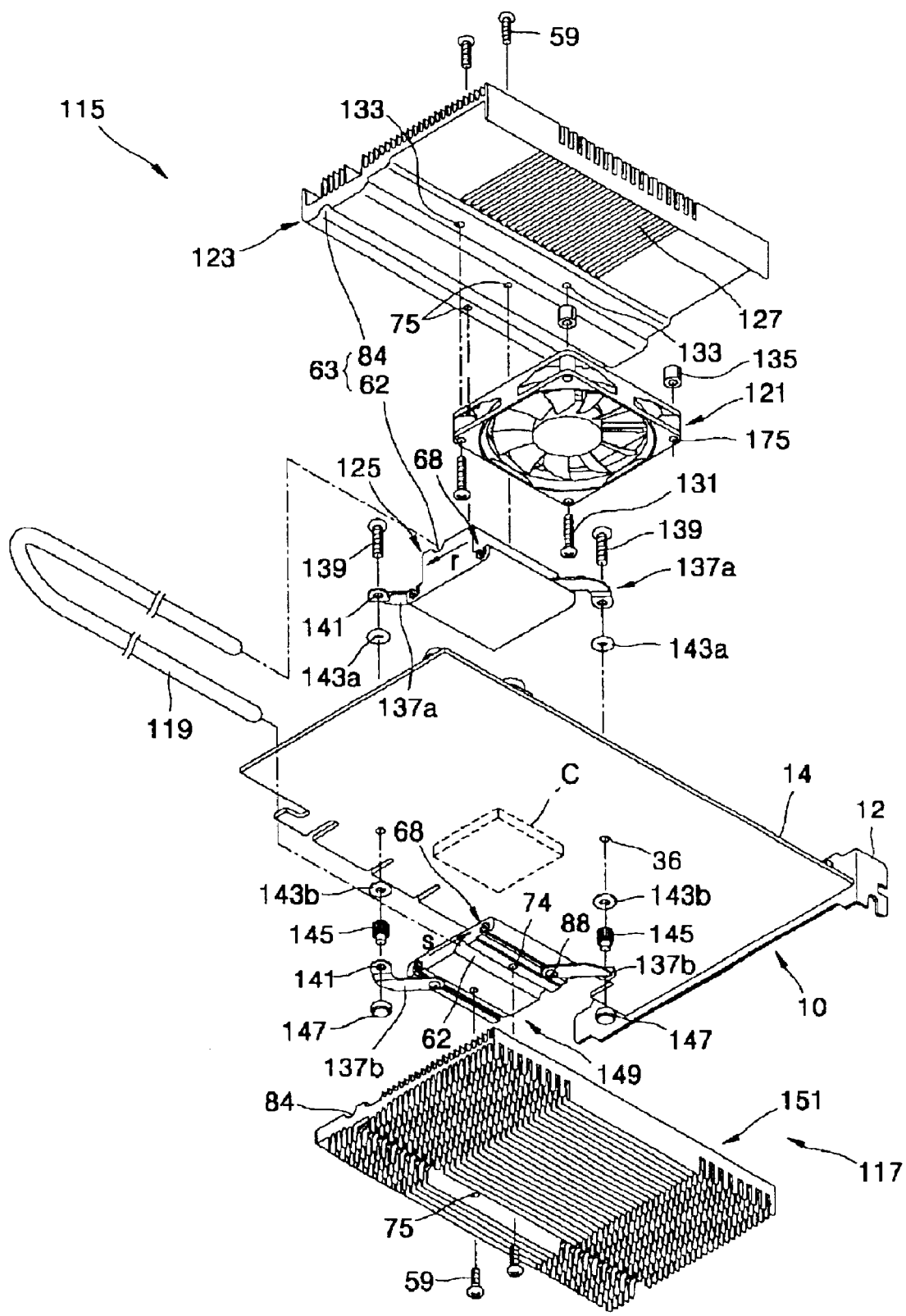
FIG. 25 is an exploded perspective view of the chipset cooling device of the VGA card in FIG. 24.

FIG. 25 is an exploded perspective view of the chipset cooling device of the VGA card in FIG. 24.

Referring to FIG. 25, the chipset C is mounted on a surface of the PCB 14. A heat-conducting block 125 is mounted to contact the top of the chipset C, and a fin plate 123 is mounted to contact the entire top surface of the heat-conducting block 125. The fin plate 123 have a plurality of heat-dissipating fins having a predetermined shape and is bound to the heat-conducting block 125 by screws 59. The screws 59 are inserted into screw holes 75 of the fin plate 123 and screwed into the heat-conducting block 125.

The heat-conducting block 125, which absorbs heat generated by the chipset C and conducts it to the fin plate 123 and the heatpipe 119, is mounted on the PCB 14 by means of a fixing unit described later. A first heatpipe receiving groove 62, which receives a portion of the heatpipe 119, is formed on the top surface of the heat-conducting block 125. The first heatpipe receiving groove 62 matches a second heatpipe receiving groove 84 formed on the bottom of the fin plate 123 and both grooves form a heatpipe insertion hole 63 which tightens around the heatpipe 119.

Support grooves 68 are formed along opposing bottom edges of the heat-conducting block 125. The support grooves 68 have the same cross-section as those described in the second and third embodiments above, but their openings face the fin plate 123, not the PCB 14. Each of the support grooves 68 engages a support bracket 137a. The support bracket 137a is a metallic part having an inner end portion engaging the support groove 68 and an outer end portion having a bolt hole 141. The support bracket 137a can pivot about its inner portion and move along the support groove 68. The functions of the support grooves 68 and the support brackets 137a and the principle by which the support brackets 137a engage the support grooves 68 are the same as described in the above embodiments.

The fin plate 123 is a heat-dissipating member comprising a plurality of fins on its top surface, and a plurality of ventilation holes 127 beside in a region which matches the heat-conducting block 125. The ventilation holes 127 let air generated by the cooling fan 121 pass.

Four internally threaded holes 133, via which the cooling fan 121 is bound to the fin plate 123, are formed at predetermined positions in the bottom of the fin plate 123.

The internally threaded holes 133 engage fan binding screws 131 passing through screw holes 175 formed at the corners of the cooling fan 121. Reference numeral 135 denotes a spacer, which is positioned between the cooling fan 121 and the fin plate 123 when binding them together.

The second heatsink 117 positioned on the bottom of the PCB 14 opposite to the first heatsink 115 includes a support block 149 and a fin plate 151 mounted to contact the support block 149.

The support block 149 is coupled to the heat-conducting block 125 via heatsink mounting holes 36 formed in the PCB 14, so that the support block 149 is fixed to the PCB 14. A first heatpipe receiving groove 62, two support grooves 68, and internally threaded holes 74 are formed on a surface of the support block 149 facing the fin plate 151.

The internally threaded holes 74 are screw holes engaging screws 59 passing through screw holes 75 formed in the fin plate 151. A second heatpipe receiving groove 84 formed on the fin plate 151 forms a heatpipe insertion hole 63 which tightens around the end portion of the heatpipe 119, together with the first heatpipe receiving groove 62.

The support grooves 68 are formed along parallel edges of the support block 149 and their openings face the fin plate 151. Each of the support grooves 68 engages a support bracket 137b. Each of the support brackets 137b has an inner end about which it can pivot and move along the corresponding support groove 68 of the support block 149.

It is preferable that surfaces of the heat-conducting block 125 and the support block 149 which face each other are parallel to each other and have an equal area. As in the second embodiment described above, the first heatpipe receiving grooves 62 on the heat-conducting block 125 and on the support block 149 are parallel to each other, but are not aligned along the same axis. In other words, the first heatpipe receiving groove 62 on the heat-conducting block 125 is positioned to be as close to the edge indicated by arrow r as possible, whereas the first heatpipe receiving groove 62 on the support block 149 is positioned to be as close to the edge indicated by arrow s as possible.

The fin plate 151 bound to the support block 149 may be the same size as the fin plate 123 of the first heatsink 115. The fin plate 151 of the second heatsink 117 has a number of fins on both surfaces thereof.

A fixing unit binding the heat-conducting block 125 and the support block 149, with the PCB 14 therebetween, includes block holding bolts 139, O-rings 143a and 143b, nipples 145, and nuts 147. The assembly structure of the fixing unit is described later with reference to FIG. 26.

Figure 26:
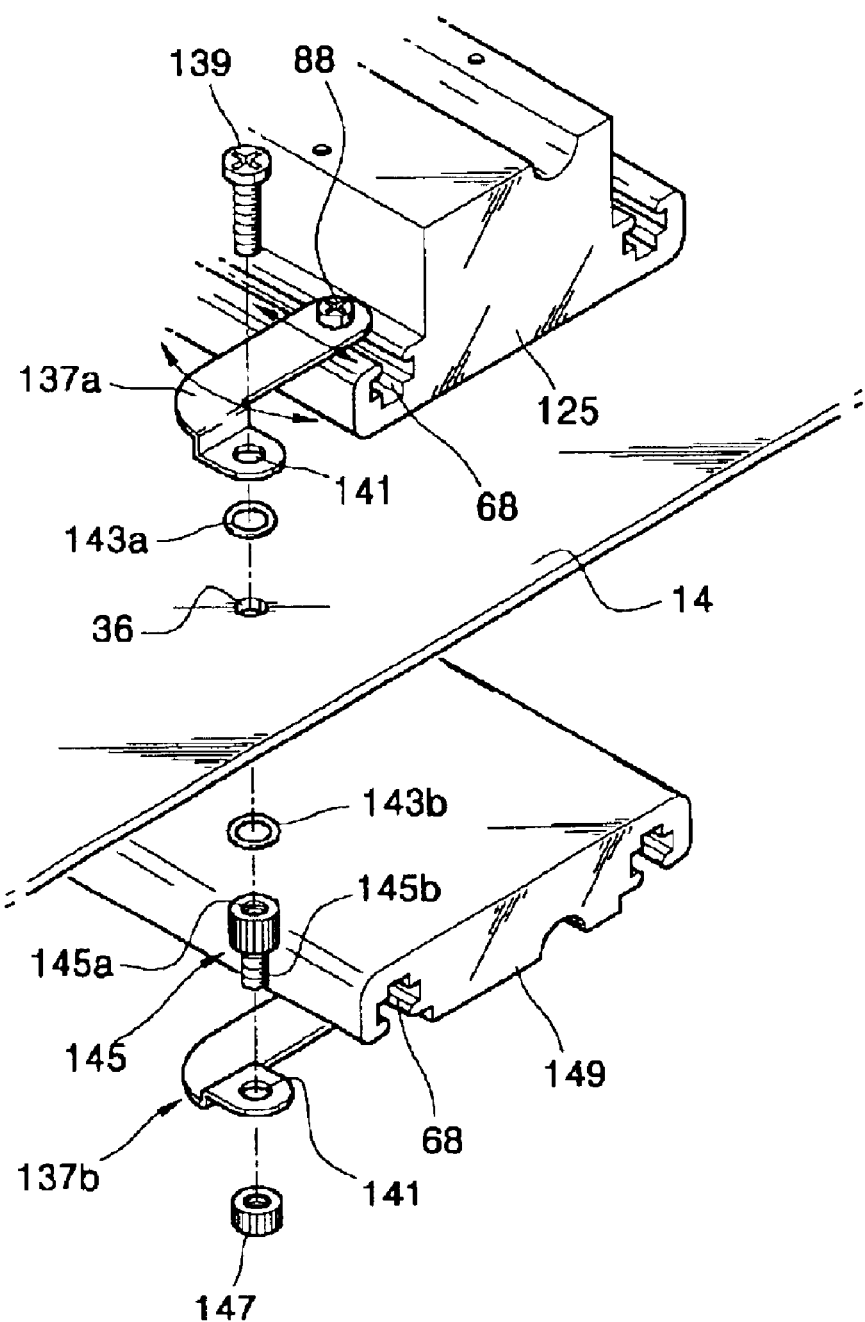
FIG. 26 is a partial exploded perspective view illustrating the mechanism of binding the heat-conducting block and the support block to the PCB in the seventh and following embodiments of the present invention.

FIG. 26 is a partial exploded perspective view illustrating a mechanism of binding the heat-conducting block 125 and the support block 149 to a PCB in the seventh and following embodiments according to the present invention.

Referring to FIG. 26, the inner portion of the support bracket 137a is linked to the support groove 68 of the heat-conducting block 125 by a bolt 88. The support bracket 137a can pivot around the bolt 88 and move along the support groove 68.

Likewise, another support bracket 137b is linked to the support groove 68 of the support block 149 by a bolt (not shown). In this state, the support bracket 137b can pivot around the bolt 88 and move along the support groove 68.

The fixing unit binding the heat-conducting block 125 and the support block 149, with the PCB 14 therebetween, includes the O-ring 143a positioned between the bolt hole 141 of the support bracket 137a; the block holding bolt 139 passing through the bolt hole 141, the O-ring 143a, and the heatsink mounting hole 36 and protruding out from the bottom of the PCB 14, the O-ring 143b through which the screw end of the block holding bolt 139 protruding out from the bottom of the PCB 14 passes; the nipple 145 having an internally threaded hole 145a engaging the protruding screw end of the block holding bolt 139 and a screw thread 145b; and the nut 147 engaging the screw thread 145b of the nipple 145.

The O-rings 143a and 143b are rubber rings for performing buffering, through which the screw end of the block holding bolt 139 passes. The nipple 145 is a known mechanical part having a coaxially aligned internally threaded hole 145 and screw thread 145b. The internally threaded hole 145 of the nipple 145 engages the bolt 139, and the screw thread 145b passes through the bolt hole 141 and engages the nut 147.

Figure 27:
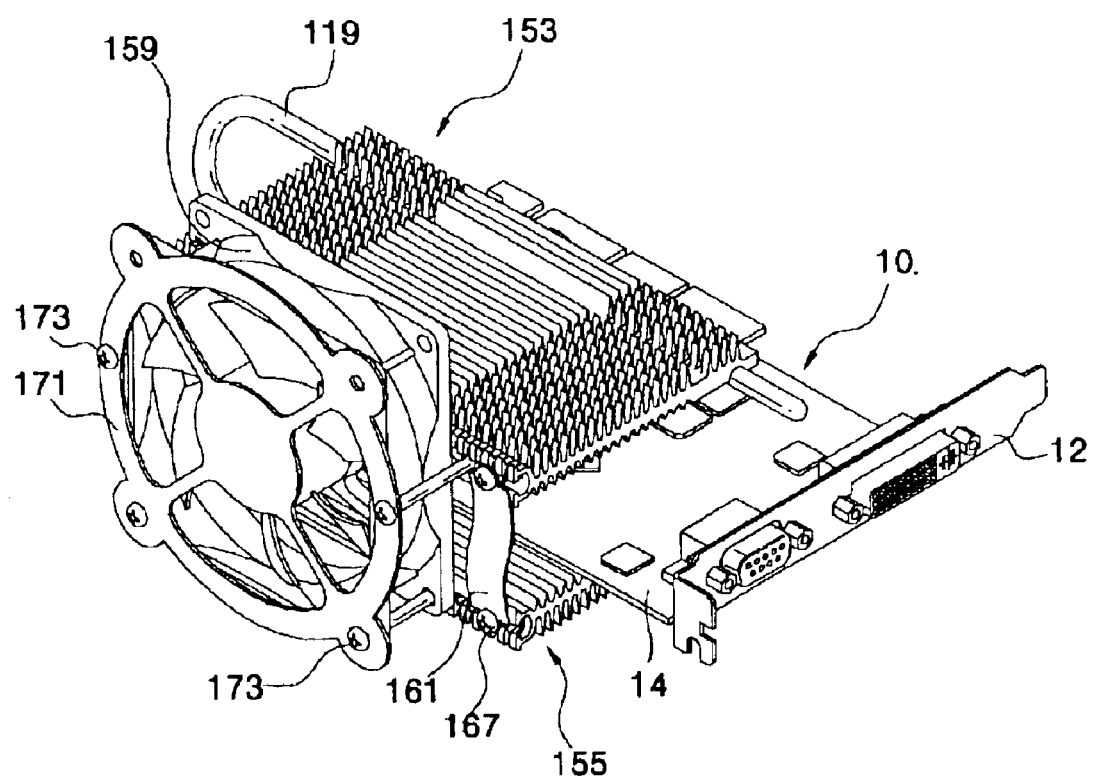
FIG. 27 is a perspective view of a chipset cooling device of a VGA card according to an eighth embodiment of the present invention.

FIG. 27 is a perspective view of a chipset cooling device of a VGA card according to an eighth embodiment of the present invention. Referring to FIG. 27, a chipset cooling device of a VGA card according to the present invention includes a first heatsink 153 mounted on a surface of a PCB 14, a second heatsink 155 mounted on the other surface of the PCB 14 opposite to the first heatsink 153, a heatpipe 119 connecting the first heatsink 153 and the second heatsink 155, and a cooling fan 159 attached to one edge of the first and second heatsinks 153 and 155 to blow cooling air toward the PCB 14.

Cooling air generated by the cooling fan 159 flows over the first and second heatsinks 153 and 155 and also cools other parts near the VGA card 10 in addition to the first and second heatsinks 153 and 155.

In FIG. 27, reference numeral 171 denotes an annular fan cover. The annular fan cover 171 is fixed to the cooling fan 159 and the first and second heatsinks 153 and 155 by fan holding screws 173.

Figure 28:
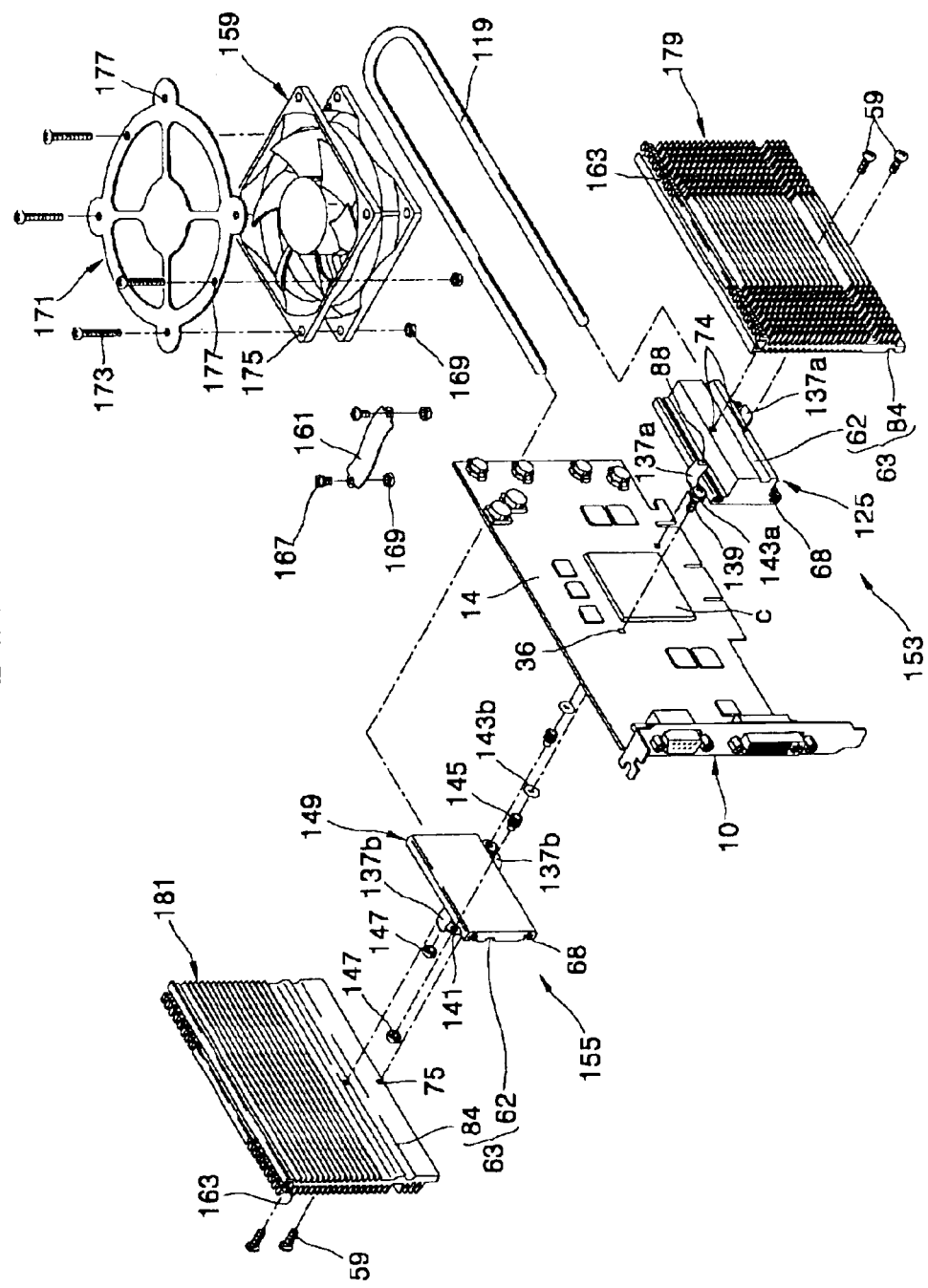
FIG. 28 is an exploded perspective of the chipset cooling device of the VGA card in FIG. 27.

FIG. 28 is an exploded perspective view of the chipset cooling device of the VGA card in FIG. 27. The mechanism of mounting the first and second heatsinks 153 and 155 on the VGA card 10 and connecting the heatpipe 119 to the first and second heatsinks 153 and 155 is the same as in the above-described seventh embodiment.

Referring to FIG. 28, the heat-conducting block 125 and the fin plate 179 are sequentially installed on the chipset C mounted on the surface of the PCB 14. The first heatpipe receiving groove 62 and the second heatpipe receiving groove 84 are formed on surfaces of the heat-conducting block 125 and the fin plate 179 which face each other, and the first heatpipe receiving groove 62 and the second heatpipe receiving groove 84 form the heatpipe insertion hole 63.

The second heatsink 155 includes the support block 149 and the fin plate 181. The first heatpipe receiving groove 62 and the second heatpipe receiving groove 84 are formed on surfaces of the support block 149 and the fin plate 181, respectively, which face each other, and together form the heatpipe insertion hole 63.

The principle of binding the heat-conducting block 125 and the support block 149 to the PCB 14 is the same as described in the preceding embodiments.

A side support groove 163 is formed on an edge of each of the fin plates 179 and 181 of the first and second heatsinks 153 and 155. The two side support grooves 163, which are parallel to each other, are connected by a support bridge 161 across an edge of the PCB 14.

The cooling fan 159 is supported by the side support grooves 163 of the fin plates 179 and 181. Also, the support bridge 161 is attached to the fin plates 179 and 181 by the side support grooves 163. The side support groove 163 extends parallel to the second heatpipe receiving groove 84 and has a consistent cross-section along the entire length.

Figure 29:
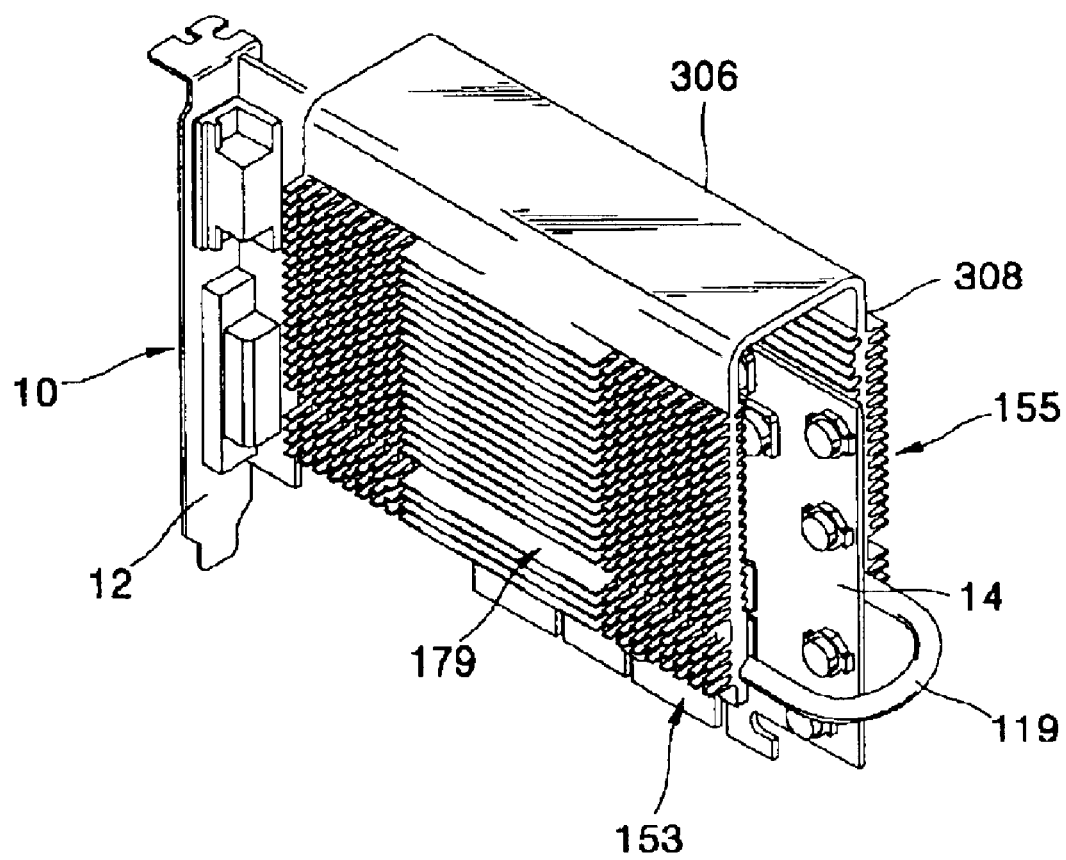
FIG. 29 is a perspective view of a chipset cooling device of a VGA card according to a ninth embodiment of the present invention.

FIG. 29 is a perspective view of a chipset cooling device of a VGA card according to a ninth embodiment of the present invention. A chipset cooling device of a VGA card according to the ninth embodiment of the present invention is the same as that of the above-described eighth embodiment, with the exception that a connection member 306 is installed instead of the cooling fan 159 and the support bridge 161.

Since the first heatsink 153 and the second heatsink 155 are connected as a single body by the connection member 306, heat of the first heatsink 153 can be conducted via the connection member 306, acting as a heat conduction path, to the second heatsink 155. The connection member 306 tightly binds the first and second heatsinks 153 and 155. Since the heat conduction efficiency of the connection member 306 is low, it cannot replace the heatpipe.

Figure 30:
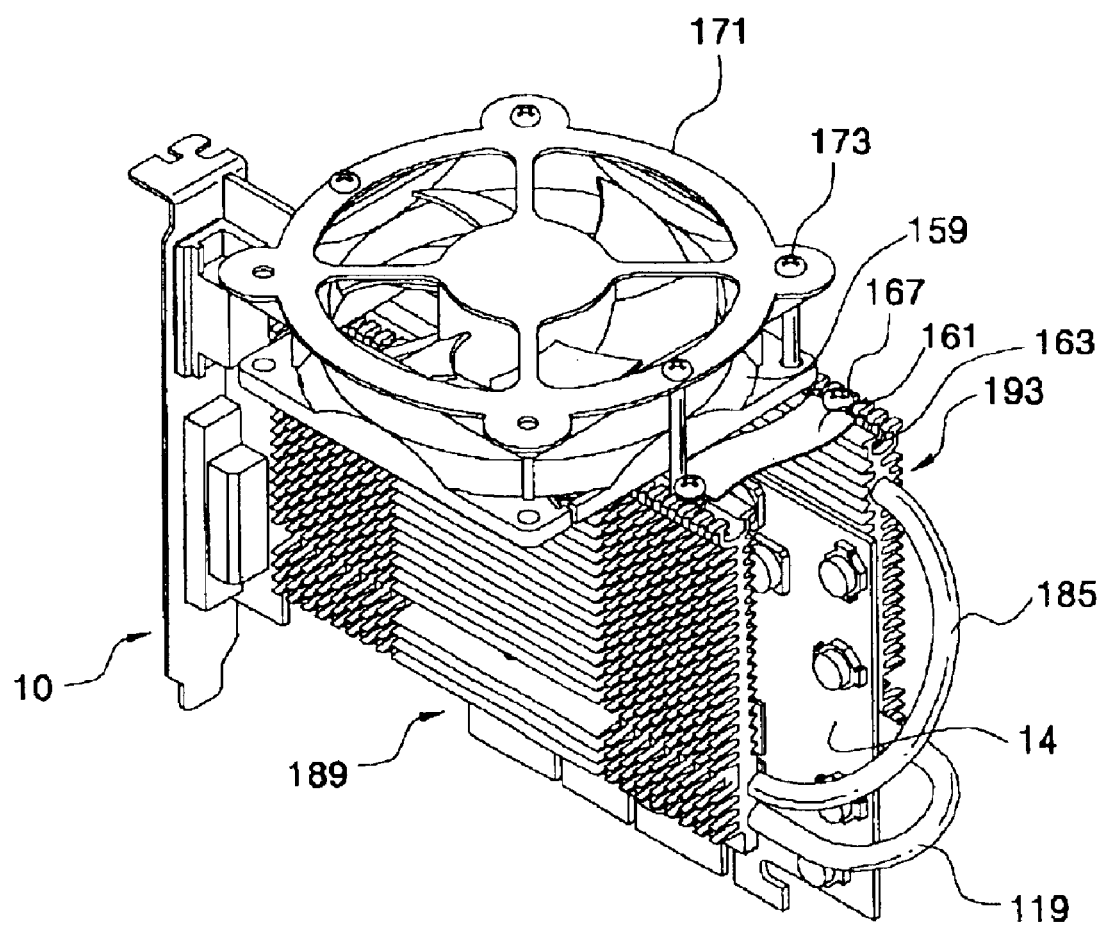
FIG. 30 is a perspective view of a chipset cooling device of a VGA card according to a tenth embodiment of the present invention.

FIG. 30 is a perspective view of a chipset cooling device of a VGA card according to a tenth embodiment of the present invention. A chipset cooling device of a VGA card according to the tenth embodiment of the present invention is the same as the above eighth embodiment of the present invention, with the exception of an additional second heatpipe 185.

Referring to FIG. 30, a chipset cooling device of a VGA card according to the tenth embodiment of the present invention includes a first heatsink 189 installed to contact the chipset C of the VGA card 10, a second heatsink 193 installed on the bottom of the VGA card 10 opposite to the first heatsink 189, two heatpipes 119 and 185 connecting the first and second heatsinks 189 and 193, a cooling fan 159 attached to edges the first and second heatsinks 189 and 193, and two support bridges 161.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A chipset cooling device of a video graphics adapter card, which cools a chipset mounted on a printed circuit board of the video graphics adapter card, the chipset cooling device comprising:
 a first heatsink mounted on the same side as the chipset to dissipate heat generated by the chipset;
 a second heatsink mounted on a side opposite to the first heatsink, with the PCB between the first and second heatsink; and
 at least one heatpipe, which connects the first heatsink and the second heatsink so as to transfer heat from the first heatsink to the second heatsink, and is folded at least once around the PCB such that an end portion is connected to the first heatsink and the other end portion is connected to the second heatsink.

2. The chipset cooling device of claim 1, wherein the heatpipe is installed in a position such that, when the video graphics adapter card is installed in a computer case, an end portion of the heatpipe connected to the first heatsink is at a lower level than the other end portion connected to the second heatsink.

3. The chipset cooling device of claim 1, wherein each of the first and second heatsinks includes a heatpipe insertion hole, and the first and second heatsinks are connected by inserting the heatpipe into the heatpipe insertion holes.

4. The chipset cooling device of claim 3, wherein each of the first and second heatsinks is comprised of two portions which together form the heatpipe insertion hole.

5. The chipset cooling device of claim 4, wherein the first heatsink comprises:
 a heat-conducting block mounted to contact the top surface of the chipset to absorb heat generated by the chipset and having a first heatpipe receiving groove which receives and contacts an end portion the heatpipe; and
 a fin plate tightly bound to the heat-conducting block and having a plurality of heat-dissipating fins which dissipate heat conducted via the heat-conducting block and a second heatpipe receiving groove which, together with the first heatpipe receiving groove, forms the heatpipe insertion hole of the first heatsink that receives and tightens around the an end portion of the heatpipe, and the second heatsink comprises:
 a support block mounted to be spaced apart from the printed circuit board and having a first heatpipe receiving groove which receives and contacts the other end portion of the heatpipe; and
 a fin plate supported by being tightly bound to the support block and having a plurality of heat-dissipating fins which dissipate heat conducted to the fin plate along the heatpipe and a second heatpipe receiving groove which forms, together with the first heatpipe receiving groove, forms the heatpipe insertion hole of the second heatsink that receives and tightens around the other end portion of the heatpipe, and the chipset cooling device further comprises a fixing unit which binds the first and second heatsinks to the printed circuit board.

6. The chipset cooling device of claim 5, wherein the first heatsink comprises at least two heatpipe insertion holes which are parallel to one another, the second heatsink comprises heatsink insertion holes which are parallel to one another and correspond with the heatpipe insertion holes of the first heatsink, and the end portions of the heatpipe are inserted into each of the heatpipe insertion holes of the first and second heatsinks.

7. The chipset cooling device of claim 1, wherein each of the first and second heatsinks comprises at least two heatpipe insertion holes and is comprised of two portions which together form the heatpipe insertion holes,
 wherein the first heatsink comprises:
 a heat-conducting block mounted to contact the top surface of the chipset to absorb heat generated by the chipset and having at least two first heatpipe receiving grooves which receive and contact the heatpipe; and
 a fin plate tightly bound to the heat-conducting block and having a plurality of heat-dissipating fins which dissipate heat conducted via the heat-conducting block and second heatpipe receiving grooves which, together with the first heatpipe receiving grooves, form the heatpipe insertion holes of the first heatsink that receive and tighten around the heatpipe, and
 the second heatsink comprises:
 a support block mounted to be spaced apart from the printed circuit board and having at least two first heatpipe receiving grooves which receive and contact the heatpipe; and a fin plate supported by being tightly bound to the support block and having a plurality of heat-dissipating fins which dissipate heat conducted to the fin plate along the heatpipe and second heatpipe receiving grooves which form, together with the first heatpipe receiving holes, the heatpipe insertion holes of the second heatsink that receive and tighten around the heatpipe, the chipset cooling device further comprises a fixing unit which binds the first and second heatsinks to the printed circuit board, and the heatpipe is formed by folding a single heatpipe in a pattern in which the heatpipe fits into every heatpipe insertion hole of the first and second heatsinks.

8. The chipset cooling device of any one of claims 5 through 7, further comprising a cooling fan attached to the first heatsink.

9. The chipset cooling device of claim 8, wherein the fin plate of the first heatsink comprises a plurality of ventilation holes in a region, and the cooling fan is fixed to correspond to the region having the plurality of ventilation holes.

10. The chipset cooling device of claim 5, wherein the heat-conducting block of the first heatsink further comprises a third heatpipe receiving groove near the first heatpipe receiving groove, which has the same shape as the first heatpipe receiving groove; the fin plate of the first heatsink further comprises a fourth heatpipe receiving groove which, together with the third heatpipe receiving groove, forms a heatpipe insertion hole that receives and tightens around the heatpipe; the fin plate of the second heatsink further comprises a heatpipe insertion hole extending parallel to and along the entire length of the fin plate; and the chipset cooling device further comprises a second heatpipe having an end portion inserted into the heatpipe insertion hole formed by the third and fourth heatpipe receiving grooves of the first heatsink and the other end portion inserted into the heatpipe insertion hole formed through the fin plate of the second heatsink.

11. The chipset cooling device of claim 5 or 10, further comprising a cooling fan mounted on edges of the fin plates of the first and second heatsinks.

12. The chipset cooling device of claim 5 or 10, further comprising at least one spacing unit attached to edges of the fin plates of the first and second heatsinks to space apart the fin plates and secure the binding of the first and second heatsinks.

13. The chipset cooling device of claim 12, wherein a side support groove is formed at an edge of each fin plate of the first and second heatsinks, and the spacing unit comprises:

a rigid support bridge whose both ends extend toward the side support grooves of the fin plates of the first and second heatsinks;

bolts passing through both ends of the support bridge and entering the side support grooves; and a nut slid into each of the side support grooves and engaging the bolt so that the support bridge is bound to the fin plates.

14. The chipset cooling device of claim 5 or 10, wherein the fin plates of the first and second heatsinks are connected as a single body by a connection member.

15. A chipset cooling device of a video graphics adapter card, which cools a chipset mounted on a printed circuit board of the video graphics adapter card, the chipset cooling device comprising:

a heatsink mounted on the same side as the chipset to dissipate heat generated by the chipset; and at least one heatpipe folded at least once such that an end portion of the heatpipe goes around the printed circuit board and extends along a side opposite to the chipset and the other end portion of the heatpipe is attached to the heatsink.

16. The chipset cooling device of claim 15, wherein the heatsink comprises at least two heatpipe insertion holes and is comprised of two portions which together form the heatpipe insertion holes, wherein the heatsink comprises:

a heat-conducting block mounted to contact the top surface of the chipset to absorb heat generated by the chipset and having at least two first heatpipe receiving grooves which receive and contact the heatpipe; and a fin plate tightly bound to the heat-conducting block and having a plurality of heat-dissipating fins which dissipate heat conducted via the heat-conducting block and second heatpipe receiving grooves which, together with the first heatpipe receiving grooves, form the heatpipe insertion holes of the heatsink that receive and tighten around the heatpipe, the chipset cooling device further comprises a fixing unit which binds the heatsink to the printed circuit board, and the heatpipe is fitted into every heatpipe insertion hole of the heatsink.

17. The chipset cooling device of claim 16, wherein the heatpipe is formed by folding a single heatpipe in a pattern in which the heatpipes fits into every heatpipe insertion hole of the heatsink.

18. The chipset cooling device of claim 16, comprising a plurality of heatpipes each having an end portion coupled to the heatpipe insertion holes of the heatsink and the other end portion extending along and parallel to the side of the printed circuit board opposite to the heatsink.

19. The chipset cooling device of claim 18, wherein the plurality of heatpipes are installed in a position such that, when the video graphics adapter card is installed in a computer case, the end portion of each of the heatpipes coupled to the heatsink is at a lower level than its other end portion.

* * * * *